(12) United States Patent
Shin et al.

(10) Patent No.: US 12,471,323 B2
(45) Date of Patent: Nov. 11, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Dongsuk Shin, Suwon-si (KR); Hyun-Kwan Yu, Suwon-si (KR); Sunyoung Lee, Yongin-si (KR); Ji Hoon Cha, Seoul (KR); Kyungyeon Hwang, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 484 days.

(21) Appl. No.: 17/889,744

(22) Filed: Aug. 17, 2022

(65) Prior Publication Data

US 2023/0231049 A1    Jul. 20, 2023

(30) Foreign Application Priority Data

Jan. 18, 2022 (KR) ......................... 10-2022-0007410
Mar. 30, 2022 (KR) ......................... 10-2022-0039763

(51) Int. Cl.
*H10D 30/69* (2025.01)
*H10D 62/10* (2025.01)
*H10D 64/27* (2025.01)
*H10D 64/68* (2025.01)

(52) U.S. Cl.
CPC ......... *H10D 30/721* (2025.01); *H10D 62/115* (2025.01); *H10D 64/514* (2025.01); *H10D 64/683* (2025.01)

(58) Field of Classification Search
CPC .. H10D 30/721; H10D 30/797; H10D 30/014; H10D 30/43; H10D 30/6735; H10D 30/7657; H10D 62/115; H10D 62/822; H10D 62/121; H10D 62/151; H10D 64/514; H10D 64/683; H10D 64/017; H10D 64/256; H10D 64/689; H10D 84/0184; H10D 84/038
See application file for complete search history.

(56) References Cited

U.S. PATENT DOCUMENTS

| 1,227,956 | A | * | 5/1917 | Sauvage | ............ | B61H 15/0021 |
|---|---|---|---|---|---|---|
| | | | | | | 188/199 |
| 7,026,688 | B2 | | 4/2006 | Kim et al. | | |
| 7,381,601 | B2 | | 6/2008 | Kim et al. | | |
| 10,263,100 | B1 | | 4/2019 | Bi et al. | | |

(Continued)

*Primary Examiner* — Dao H Nguyen
(74) *Attorney, Agent, or Firm* — Sughrue Mion, PLLC

(57) ABSTRACT

A semiconductor device includes a substrate including an active pattern, a channel pattern on the active pattern and including semiconductor patterns, a source/drain pattern connected to the semiconductor patterns, a gate electrode on the semiconductor patterns, and a gate dielectric layer between the gate electrode and the semiconductor patterns. An inner spacer of the gate dielectric layer includes a horizontal portion between the high-k dielectric layer and the second semiconductor pattern, a vertical portion between the high-k dielectric layer and the source/drain pattern, and a corner portion between the horizontal portion and the vertical portion. A first thickness of the horizontal portion is less than a second thickness of the vertical portion. The second thickness of the vertical portion is less than a third thickness of the corner portion.

13 Claims, 32 Drawing Sheets

(56) References Cited

U.S. PATENT DOCUMENTS

| | | |
|---|---|---|
| 10,522,616 B2 | 12/2019 | Cho et al. |
| 10,553,679 B2 | 2/2020 | Zhang et al. |
| 10,964,798 B2 * | 3/2021 | Cheng ................ H10D 30/6741 |
| 11,664,441 B2 * | 5/2023 | Lin ........................ H10D 30/43 |
| | | 438/151 |
| 2017/0222006 A1 * | 8/2017 | Suh .................... H10D 30/6757 |
| 2020/0105929 A1 | 4/2020 | Zhang et al. |
| 2020/0381545 A1 | 12/2020 | Chiang et al. |
| 2021/0202758 A1 | 7/2021 | Yeong et al. |
| 2021/0217877 A1 | 7/2021 | Ho et al. |
| 2021/0343578 A1 | 11/2021 | Chang et al. |
| 2021/0376093 A1 | 12/2021 | Chu et al. |

\* cited by examiner

SEMICONDUCTOR DEVICE AND METHOD OF FABRICATING THE SAME

CROSS-REFERENCE TO RELATED APPLICATIONS

This U.S. nonprovisional application claims priority under 35 U.S.C § 119 to Korean Patent Application No. 10-2022-0007410 filed on Jan. 18, 2022 and Korean Patent Application No. 10-2022-0039763 filed on Mar. 30, 2022, in the Korean Intellectual Property Office, the disclosures of which are hereby incorporated by reference in their entirety.

BACKGROUND

The present disclosure relates to a semiconductor device and a method of fabricating the same, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scaling down of the MOSFETs may deteriorate operating properties of the semiconductor device. Accordingly, various studies have been conducted to develop methods of fabricating semiconductor devices having superior performance while overcoming limitations caused by high integration of the semiconductor devices.

SUMMARY

It is an aspect to provide a semiconductor device with improved electrical properties.

It is another aspect to provide a method of fabricating a semiconductor device having improved electrical properties.

According to an aspect of some embodiments, a semiconductor device may comprise a substrate that includes an active pattern; a channel pattern on the active pattern, the channel pattern including a plurality of semiconductor patterns that are vertically stacked and spaced apart from each other; a source/drain pattern connected to the plurality of semiconductor patterns; a gate electrode on the plurality of semiconductor patterns; and a gate dielectric layer between the gate electrode and the plurality of semiconductor patterns. The gate electrode may include a first portion between a first semiconductor pattern and a second semiconductor pattern that are adjacent ones of the plurality of semiconductor patterns. The gate dielectric layer may include a high-k dielectric layer that surrounds the first portion of the gate electrode; and an inner spacer on the high-k dielectric layer. The inner spacer may include a horizontal portion between the high-k dielectric layer and the second semiconductor pattern, the horizontal portion having a first thickness; a vertical portion between the high-k dielectric layer and the source/drain pattern, the vertical portion having a second thickness; and a corner portion between the horizontal portion and the vertical portion, the corner portion having a third thickness. The first thickness may be less than the second thickness, and the second thickness may be less than the third thickness.

According to another aspect of some embodiments, a semiconductor device may comprise: a substrate that includes an active pattern; a channel pattern on the active pattern, the channel pattern including a plurality of semiconductor patterns that are vertically stacked and spaced apart from each other; a pair of source/drain patterns on the active pattern, the plurality of semiconductor patterns being between the pair of source/drain patterns; a gate electrode on the plurality of semiconductor patterns; and a gate dielectric layer between the gate electrode and the plurality of semiconductor patterns. The gate electrode may include a portion between a first semiconductor pattern and a second semiconductor pattern that are adjacent ones of the plurality of semiconductor patterns. The gate dielectric layer may include a high-k dielectric layer that surrounds the portion of the gate electrode; and an inner spacer on the high-k dielectric layer. An inner region may be defined by the pair of source/drain patterns, the first semiconductor pattern, and the second semiconductor pattern. The inner spacer may be within the inner region, the inner spacer may include an inner gate space, the high-k dielectric layer and the portion of the gate electrode may be in the inner gate space, the inner region may have a first side, and the inner gate space may have a second side adjacent to the first side.

According to yet another aspect of some embodiments, a semiconductor device may comprise a substrate that includes an active region; a device isolation layer that defines an active pattern on the active region; a channel pattern and a source/drain pattern on the active pattern, the channel pattern including a plurality of semiconductor patterns that are vertically stacked and spaced apart from each other; a gate electrode on the plurality of semiconductor patterns; a gate dielectric layer between the plurality of semiconductor patterns and the gate electrode; a gate spacer on a sidewall of the gate electrode; a gate capping pattern on a top surface of the gate electrode; an interlayer dielectric layer on the gate capping pattern; an active contact that penetrates the interlayer dielectric layer and is electrically connected to the source/drain pattern; a metal-semiconductor compound layer between the active contact and the source/drain pattern; a gate contact that penetrates the interlayer dielectric layer and the gate capping pattern and is electrically connected to the gate electrode; a first metal layer on the interlayer dielectric layer, the first metal layer including a power line and a plurality of first lines, the plurality of first lines being correspondingly electrically connected to the active contact and the gate contact; and a second metal layer on the first metal layer. The second metal layer may include a plurality of second lines electrically connected to the first metal layer. The gate electrode may include a portion between a first semiconductor pattern and a second semiconductor pattern that are adjacent ones of the plurality of semiconductor patterns. The source/drain pattern may include a protrusion that protrudes toward the portion of the gate electrode. The protrusion of the source/drain pattern may have a first convex sidewall directed toward the portion of the gate electrode. The portion of the gate electrode may have a second convex sidewall directed toward the first convex sidewall of the protrusion.

According to yet another aspect of some embodiments, a method of fabricating a semiconductor device may comprise forming, on a substrate, a stack pattern that includes a plurality of active layers and a plurality of sacrificial layers that are alternately stacked with each other; forming, on the stack pattern, a sacrificial pattern that extends in a first direction; using the sacrificial pattern as a mask to etch the stack pattern to form a pair of recesses that are correspondingly adjacent to sides of the sacrificial pattern; forming a pair of source/drain patterns in each recess of the pair of recesses, the active layers between the pair of source/drain patterns forming a plurality of semiconductor patterns that constitute a channel pattern; removing the sacrificial pattern and the sacrificial layers to expose the plurality of semiconductor patterns; forming a gate dielectric layer on the exposed plurality of semiconductor patterns; and forming a gate electrode on the gate dielectric layer. The plurality of semiconductor patterns may include a first semiconductor pattern and a second semiconductor pattern that are adjacent to each other. The forming the gate dielectric layer may include forming a first dielectric layer in an inner region that is defined by the pair of source/drain patterns, the first semiconductor pattern, and the second semiconductor pattern; partially etching the first dielectric layer to form an inner spacer that includes an inner gate space with the inner spacer; and forming a high-k dielectric layer in the inner gate space.

DETAILED DESCRIPTION

Figure 1:
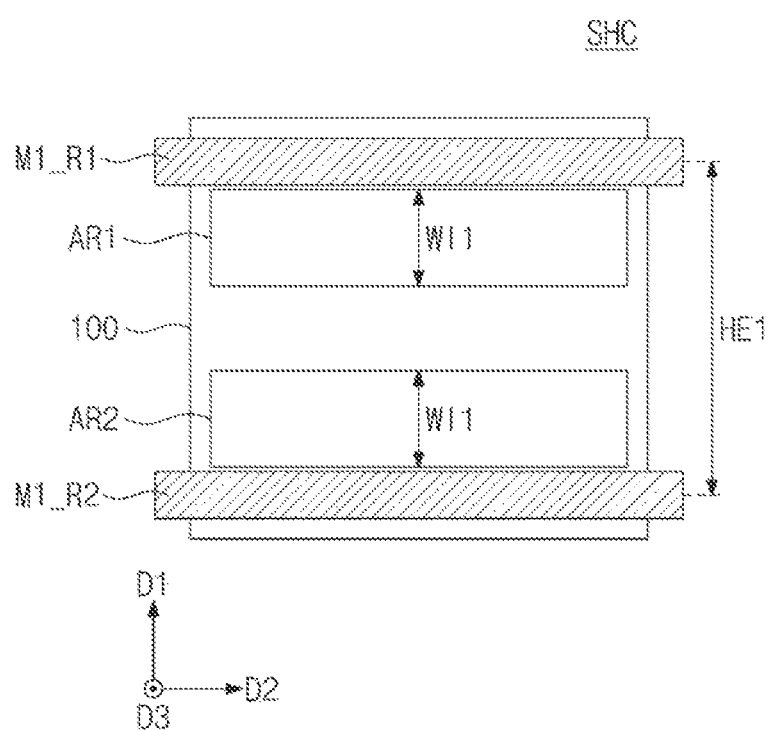
FIGS. 1 to 3 illustrate conceptual views showing logic cells of a semiconductor device according to some embodiments.
Figure 2:
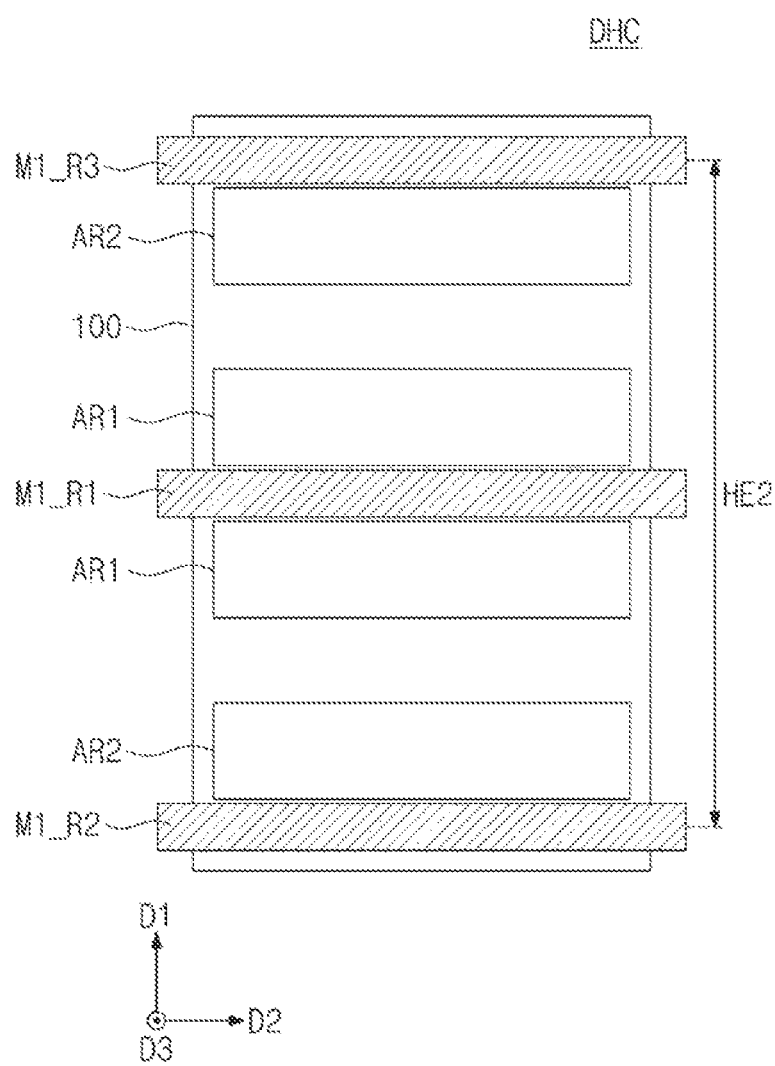
Figure 3:
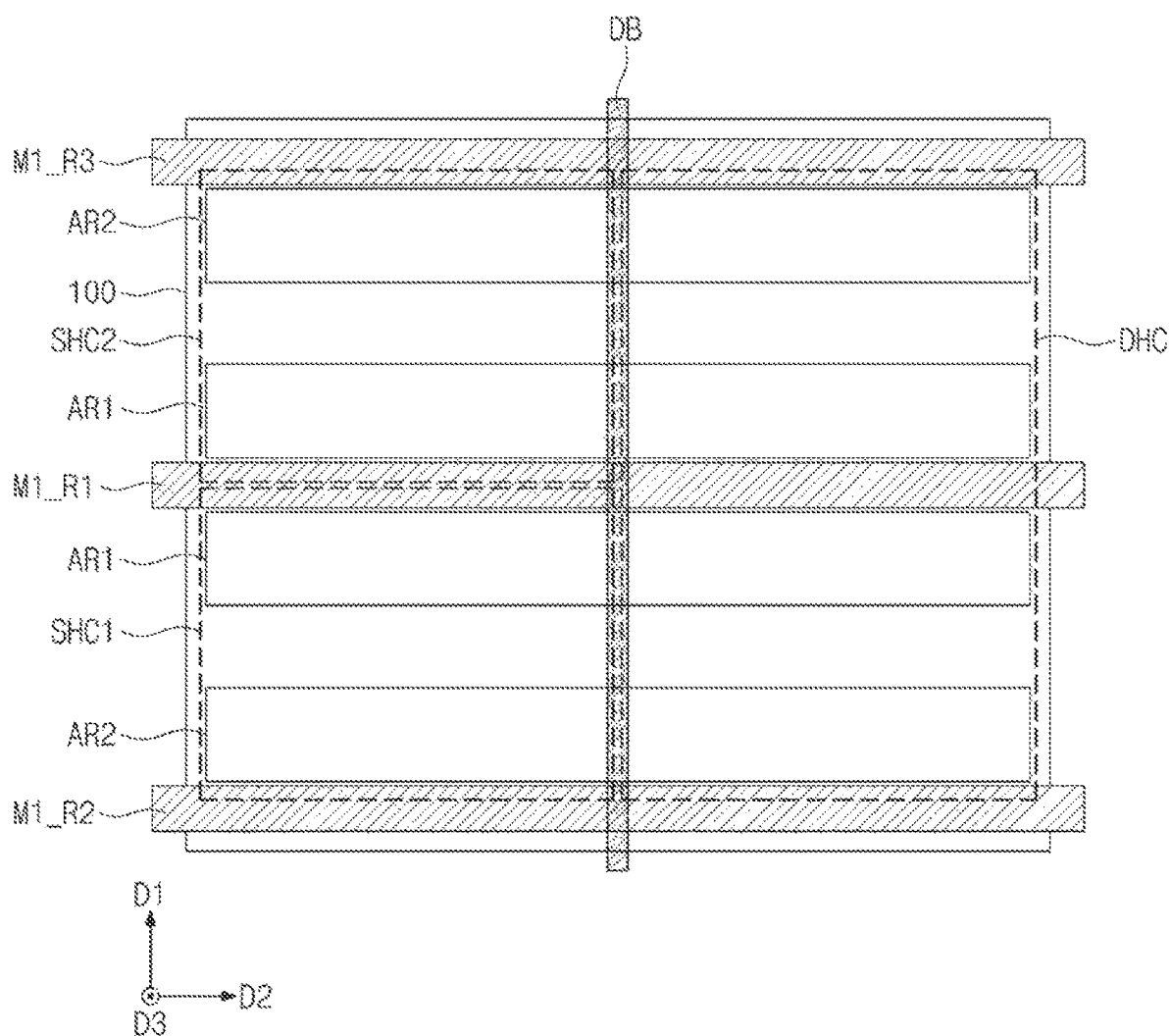

FIGS. 1 to 3 illustrate conceptual views showing logic cells of a semiconductor device according to some embodiments.

Referring to FIG. 1, a single height cell SHC may be provided. For example, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

Each of the first and second active regions AR1 and AR2 may have a first width WI1 in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, or an inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage VSS.

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may be defined to indicate a length in the first direction D1 of the double height cell DHC. The second height HE2 may be about twice the first height HE1 of FIG. 1. The two first active regions AR1 of the double height cell DHC may collectively operate as one active region.

In the present disclosure, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be located between a first power line M1_R1 and a second power line M1_R2. The second single height cell SHC2 may be located between the first power line M1_R1 and a third power line M1_R3. The second single height cell SHC2 may be adjacent in a first direction D1 to the first single height cell SHC1.

The double height cell DHC may be located between the second power line M1_R2 and the third power line M1_R3. The double height cell DHC may be adjacent in a second direction D2 to each of the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4:
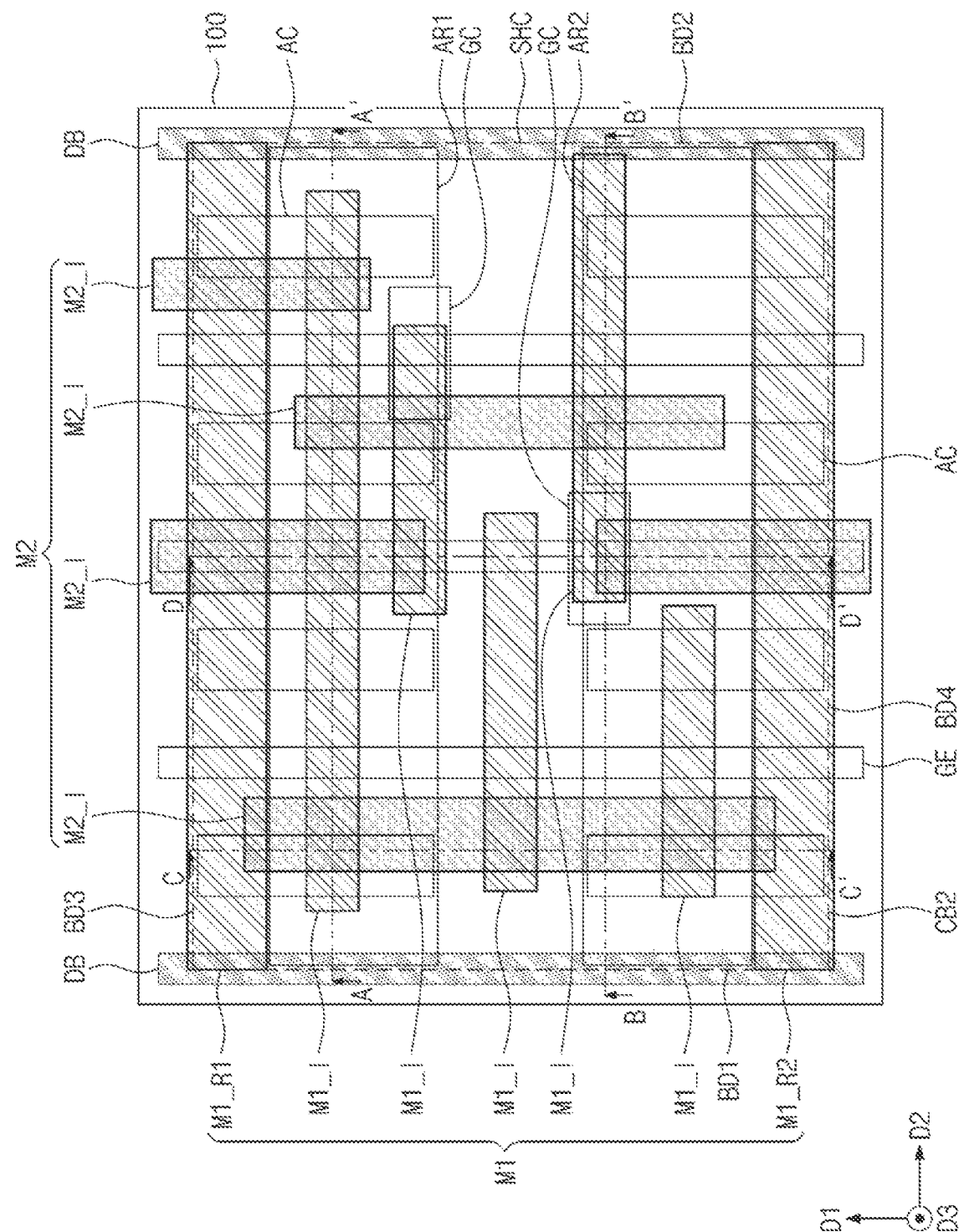
FIG. 4 illustrates a plan view showing a semiconductor device according to some embodiments.
Figure 5A:
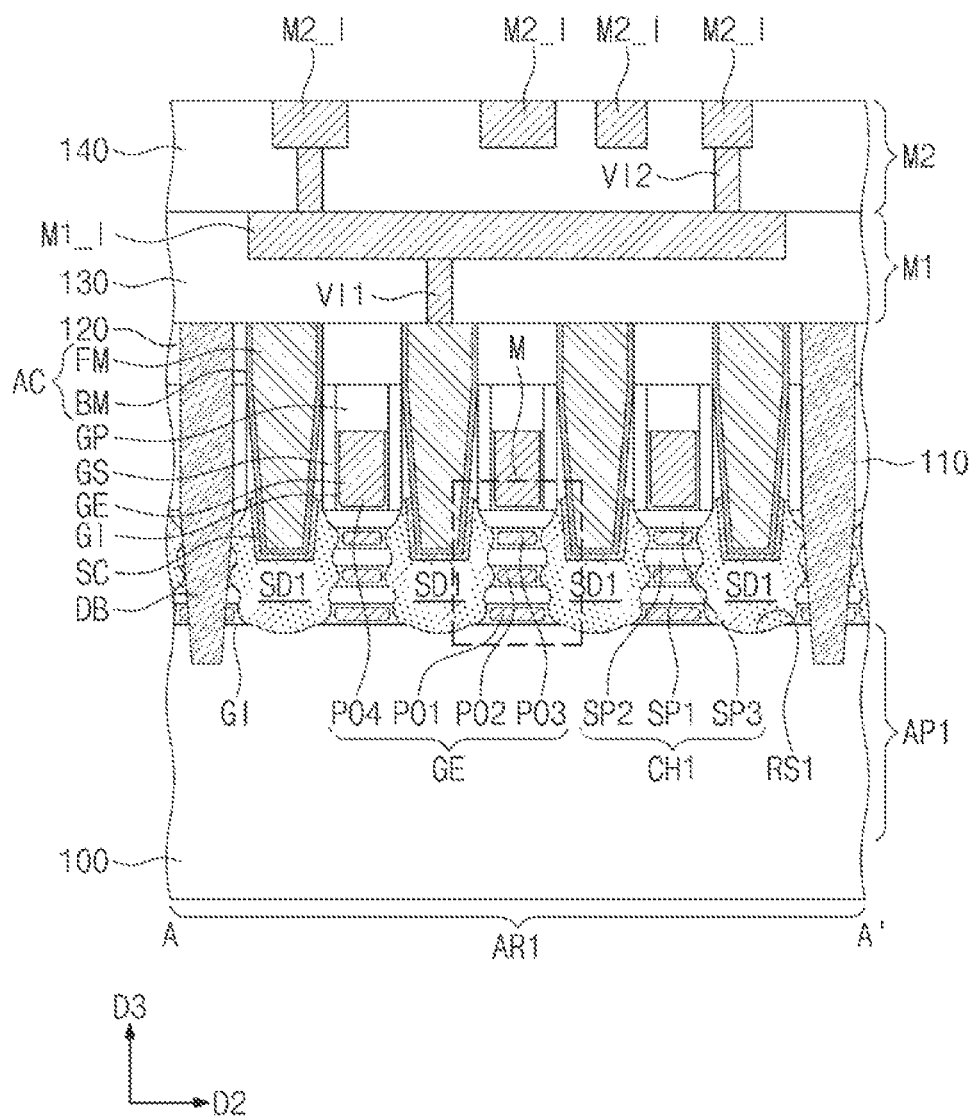
FIGS. 5A, 5B, 5C, and 5D illustrate cross-sectional views respectively taken along lines A-A', B-B', C-C', and D-D' of FIG. 4.
Figure 5B:
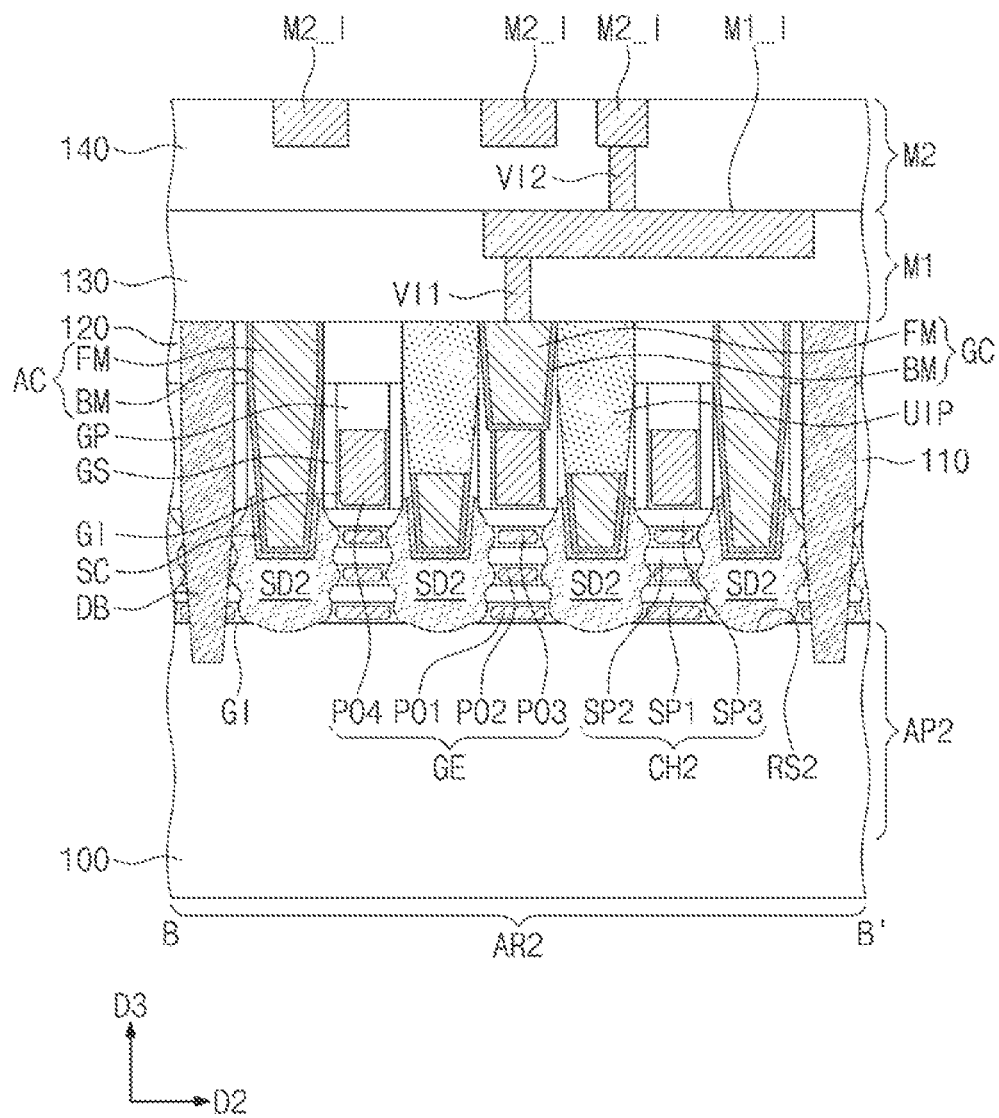

FIG. 4 illustrates a plan view showing a semiconductor device according to some embodiments. FIGS. 5A, 5B, 5C, and 5D illustrate cross-sectional views respectively taken along lines A-A', B-B', C-C', and D-D' of FIG. 4. FIG. 6 illustrates an enlarged view showing an example of section M depicted in FIG. 5A. A semiconductor device shown in FIGS. 4 and 5A to 5D may be a specific example of the single height cell SHC depicted in FIG. 1.

Referring to FIGS. 4 and 5A to 5D, a single height cell SHC may be provided on a substrate 100. The single height cell SHC may be provided thereon with logic transistors that constitute a logic circuit. The substrate 100 may be a compound semiconductor substrate or a semiconductor substrate including silicon, germanium, or silicon-germanium. For example, in some embodiments, the substrate 100 may be a silicon substrate.

The substrate 100 may include a first active region AR1 and a second active region AR2. Each of the first and second active regions AR1 and AR2 may extend in a second direction D2. For example, the first active region AR1 may be an NMOSFET region, and the second active region AR2 may be a PMOSFET region.

Figure 5C:
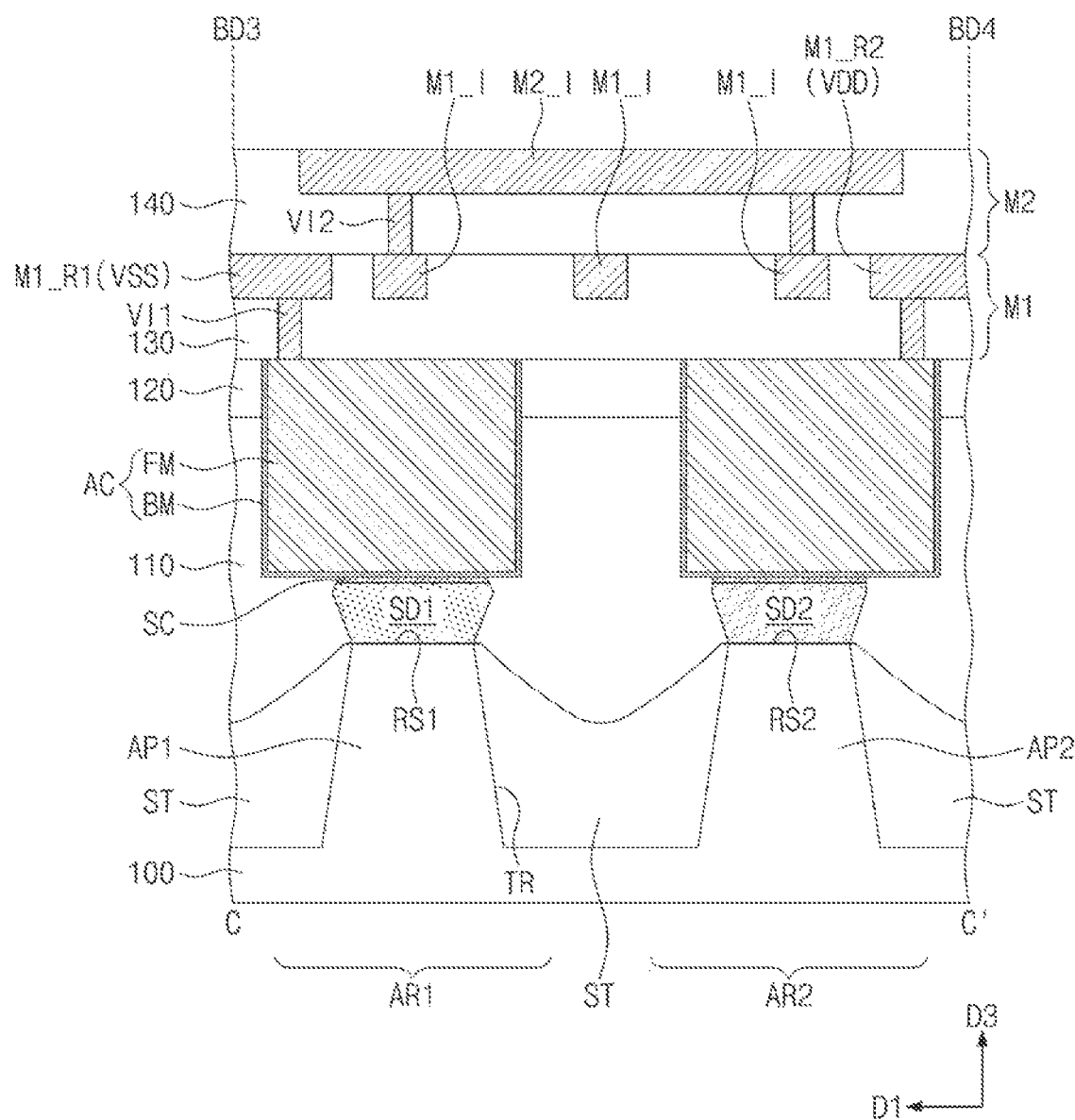
Figure 5D:
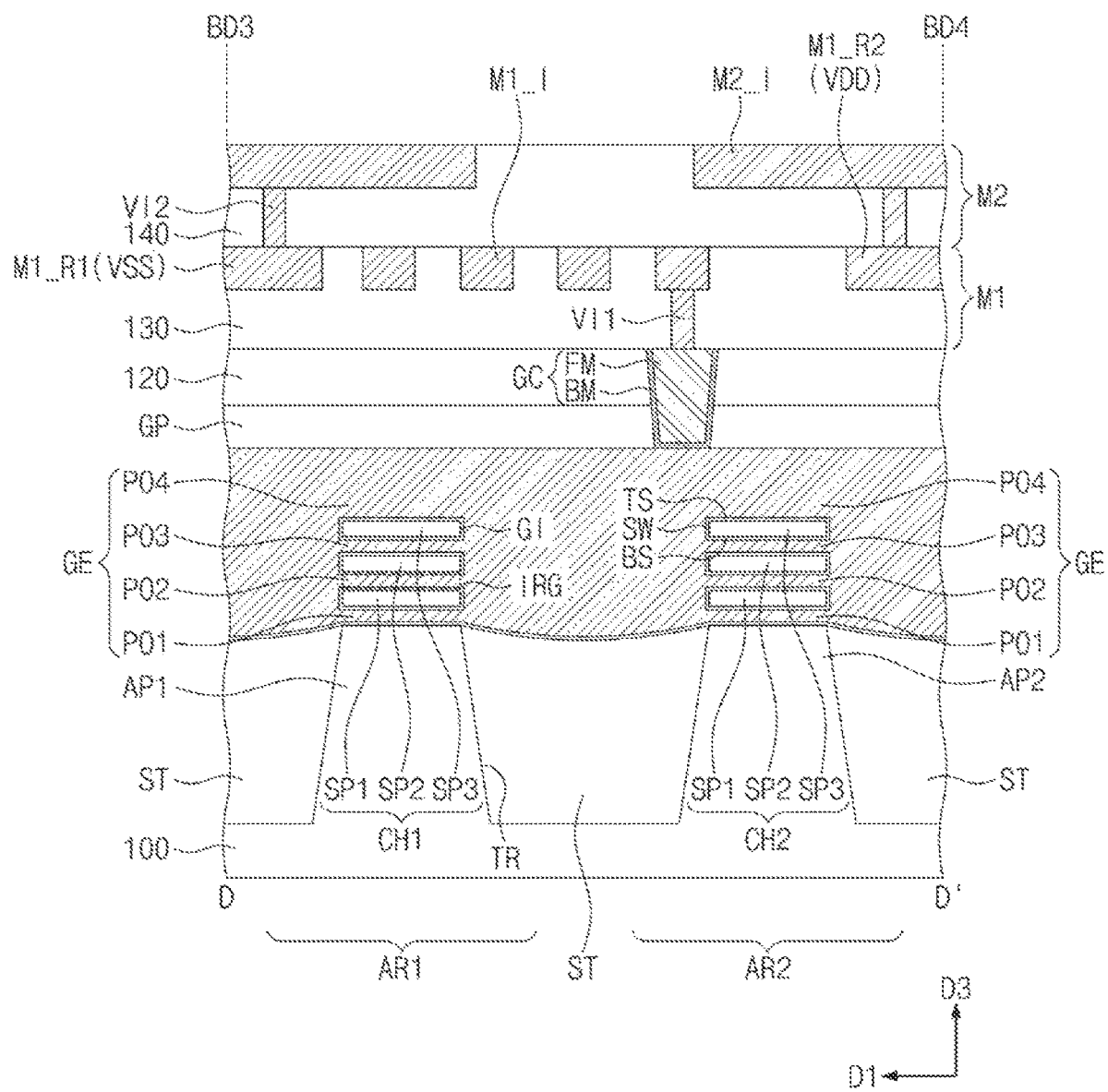
Figure 6:
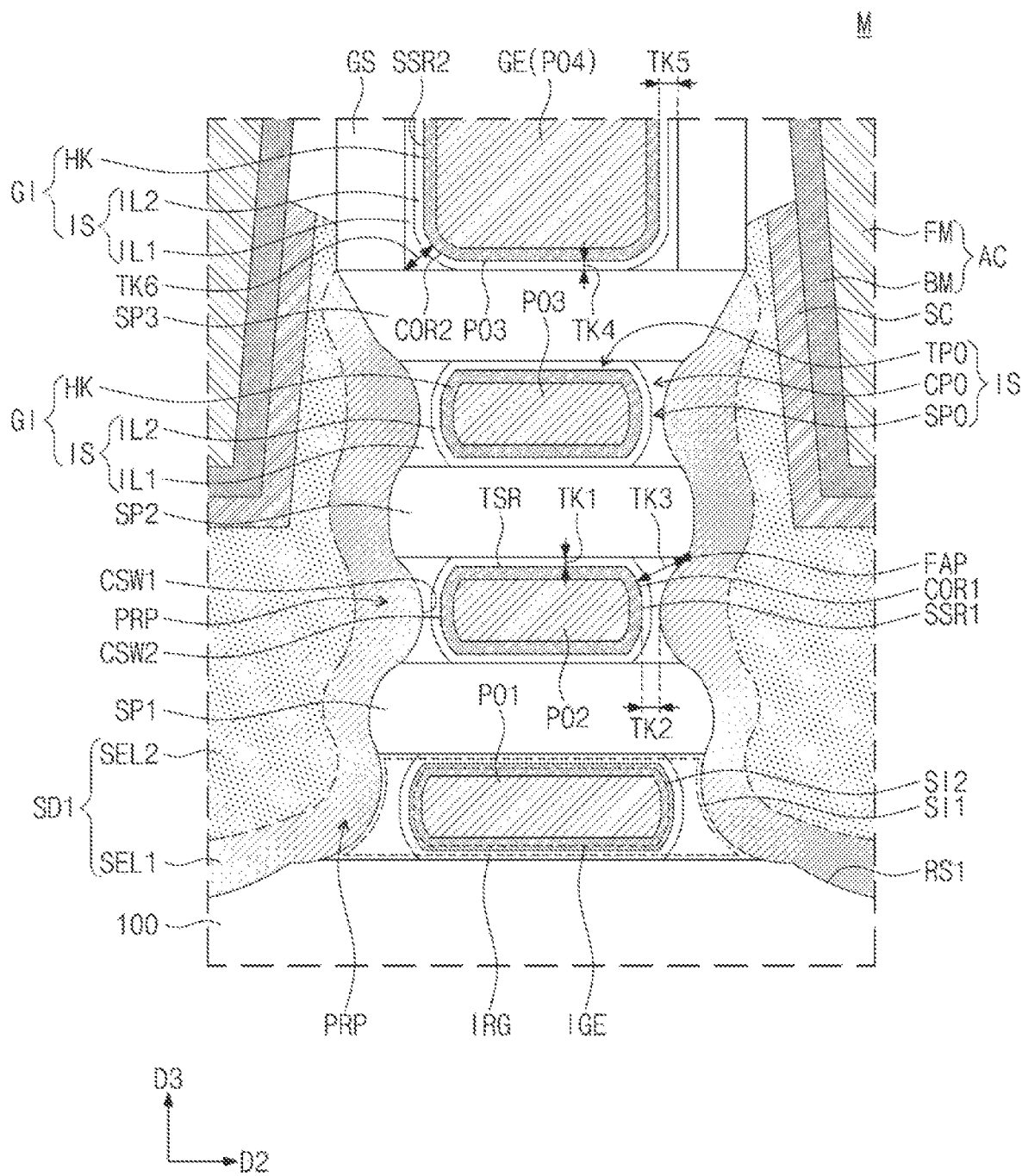
FIG. 6 illustrates an enlarged view showing an example of section M depicted in FIG. 5A.

A first active pattern AP1 and a second active pattern AP2 may be defined by a trench TR formed on an upper portion of the substrate 100 (best seen in FIGS. 5C and 5D). The first active pattern AP1 may be provided on the first active region AR1, and the second active pattern AP2 may be provided on the second active region AR2. The first and second active patterns AP1 and AP2 may extend in the second direction D2. The first and second active patterns AP1 and AP2 may be vertically (i.e., in a third direction D3) protruding portions of the substrate 100.

A device isolation layer ST may be provided on the substrate 100. The device isolation layer ST may fill the trench TR. The device isolation layer ST may include a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3.

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

A plurality of first source/drain patterns SD1 may be provided on the first active pattern AP1 (best seen in FIG. 5A). A plurality of first recesses RS1 may be formed on an upper portion of the first active pattern AP1. The first source/drain patterns SD1 may be provided in corresponding first recesses RS1. The first source/drain patterns SD1 may be impurity regions of a first conductivity type (e.g., n-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2 (best seen in FIG. 5B). A plurality of second recesses RS2 may be formed on an upper portion of the second active pattern AP2. The second source/drain patterns SD2 may be provided in corresponding second recesses RS2. The second source/drain patterns SD2 may be impurity regions of a second conductivity type (e.g., p-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth (SEG) process. For example, in some embodiments, each of the first and second source/drain patterns SD1 and SD2 may have a top surface higher than that of the third semiconductor pattern SP3. For another example, in some embodiments, at least one selected from the first and second source/drain patterns SD1 and SD2 may have a top surface at substantially the same level as that of a top surface of the third semiconductor pattern SP3.

In an embodiment, the first source/drain patterns SD1 may include a semiconductor element (e.g., Si) the same as that of the substrate 100. The second source/drain patterns SD2 may include a semiconductor element (e.g., SiGe) whose lattice constant is greater than that of a semiconductor element of the substrate 100. The pair of second source/drain patterns SD2 may therefore provide a compressive stress to the second channel pattern CH2 therebetween.

Each of the first and second source/drain patterns SD1 and SD2 may have an uneven embossing shape at its sidewall. For example, each of the first and second source/drain patterns SD1 and SD2 may have a wavy profile at its sidewall. The sidewall of each of the first and second source/drain patterns SD1 and SD2 may protrude toward the first, second, and third portions PO1, PO2, and PO3 of a gate electrode GE which will be discussed below.

A plurality of gate electrodes GE may be provided to extend in a first direction D1, while running across the first and second channel patterns CH1 and CH2. The gate electrodes GE may be arranged in the second direction D2 at a first pitch. Each of the gate electrodes GE may vertically overlap a corresponding one of the first and second channel patterns CH1 and CH2.

The gate electrode GE may include a first portion PO1 interposed between the first semiconductor pattern SP1 and one of the first and second active patterns AP1 and AP2, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5D, the gate electrode GE may be provided on a top surface TS, a bottom surface BS, and both sidewalls SW of each of the first, second, and third semiconductor patterns SP1, SP2, and SP3. In this sense, a transistor according to the embodiment illustrated in FIGS. 4 and 5A to 5D may be a three-dimensional field effect transistor (e.g., MBCFET or GAAFET) in which the gate electrode GE three-dimensionally surrounds the first and second channel patterns CH1 and CH2.

Referring back to FIGS. 4 and 5A to 5D, a pair of gate spacers GS may be disposed on both sidewalls of the fourth portion PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. In an embodiment, the gate spacers GS may include at least one selected from SiCN, SiCON, and SiN. Alternatively, the gate spacers GS may include a multi-layer formed of two or more of SiCN, SiCON, and SiN. For example, the gate spacer GS may include a first spacer and a second spacer.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the both sidewalls SW of each of the first, second, and third semiconductor patterns SP1, SP2, and SP3. The gate dielectric layer GI may cover a top surface of the device isolation layer ST below the gate electrode GE.

In an embodiment, as shown in FIG. 6, the gate dielectric layer GI may include an inner spacer IS and a high-k dielectric layer HK. In an embodiment, the inner spacer IS may include a first dielectric layer IL1 and a second dielectric layer IL2. Each of the first and second dielectric layer IL1 and IL2 may include a dielectric material that contains silicon (Si). Each of the first and second dielectric layers IL1 and IL2 may include a silicon oxide layer, a silicon oxynitride layer, or a silicon nitride layer.

The high-k dielectric layers HK may include a high-k dielectric material whose dielectric constant is greater than that of a silicon oxide layer. For example, the high-k dielectric layer HK may include at least one selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In an embodiment, a semiconductor device may include a negative capacitance field effect transistor that uses a negative capacitor. For example, the high-k dielectric layer HK may include a ferroelectric material layer exhibiting ferroelectric properties, a paraelectric material layer exhibiting paraelectric properties, or a combination thereof.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing (SS) of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to about 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but embodiments are not limited thereto. Because ferroelectric materials have their own critical thickness that exhibits ferroelectric properties, the thickness of the ferroelectric material layer may depend on the ferroelectric material.

For example, the high-k dielectric layer may include one ferroelectric material layer. For another example, the high-k dielectric layer HK may include a plurality of ferroelectric material layers that are spaced apart from each other. The high-k dielectric layer HK may have a stack structure in which a plurality of ferroelectric material layers are stacked alternately with a plurality of paraelectric material layers.

Referring back to FIGS. 4 and 5A to 5D, the gate electrode GE may include a first metal pattern and a second metal pattern on the first metal pattern. The first metal pattern may be provided on the gate dielectric layer GI to be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a threshold voltage of a transistor. For example, the first, second, and third portions PO1, PO2, and PO3 of the gate electrode GE may be formed of the first metal pattern that is a work-function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than a resistance of the first metal pattern. For example, the second metal pattern may include at least one metal selected from tungsten (W), aluminum (Al), titanium (Ti), and tantalum (Ta). For example, the fourth portion PO4 of the gate electrode GE may include the first metal pattern and the second metal pattern on the first metal pattern.

A first interlayer dielectric layer 110 may be provided on the substrate 100 (best seen in FIG. 5C). The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

As shown in FIG. 4, the single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The signal height cell SHC may be provided on its both sides with a pair of separation structures DB that are opposite to each other in the second direction D2. For example, the pair of separation structures DB may be correspondingly provided on the first and second boundaries BD1 and BD2 of the single height cell SHC. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120 to extend into the first and second active patterns AP1 and AP2. The separation structure DB may penetrate the upper portion of each of the first and second active patterns AP1 and AP2. The separation structure DB may electrically separate an active region of the single height cell SHC from an active region of adjacent cell.

Active contacts AC may be provided to penetrate the first and second interlayer dielectric layers 110 and 120 and to correspondingly electrically connect to the first and second source/drain patterns SD1 and SD2. A pair of active contacts AC may be provided on both sides of the gate electrode GE. That is, one active contact AC may be provided on either side of the gate electrode GE. When viewed in plan, the active contact AC may have a bar shape that extends in the first direction D1 as illustrated in FIG. 4.

The active contact AC may be a self-aligned contact. For example, the gate capping pattern GP and the gate spacer GS may be used to form the active contact AC in a self-alignment manner. For example, the active contact AC may cover at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one selected from titanium silicide, tantalum silicide, tungsten silicide, nickel silicide, and cobalt silicide.

Gate contacts GC may be provided to penetrate the second interlayer dielectric layer 120 and the gate capping pattern GP and to electrically connect to corresponding gate electrodes GE. When viewed in plan, the gate contact GC may be disposed between the first active region AR1 and the second active region AR2. For example, the gate contact GC may be provided on the second active pattern AP2 (see FIG. 5B).

In an embodiment, referring to FIG. 5B, an upper dielectric pattern UIP may fill an upper portion of each of the active contacts AC, which upper portion is adjacent to the gate contact GC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent the occurrence of electrical short due to contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in the third interlayer dielectric layer 130. For example, the first metal layer M1 may include a first power line M1_R1, a second power line M1_R2, and first wiring lines M1_I. The lines M1_R1, M1_R2, and M1_I of the first metal layer M1 may parallel extend in the second direction D2.

For example, the first and second power lines M1_R1 and M1_R2 may be correspondingly provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I of the first metal layer M1 may be disposed between the first and second power lines M1_R1 and M1_R2 of the first metal layer M1. The first wiring lines M1_I of the first metal layer M1 may be arranged along the first direction D1 at a second pitch. The second pitch may be less than the first pitch. Each of the first wiring lines M1_I may have a line-width less than that of each of the first and second power lines M1_R1 and M1_R2.

The first metal layer M1 may further include first vias VI1. The first vias VI1 may be correspondingly provided below the lines M1_R1, M1_R2, and M1_I of the first metal layer M1. The first via VI1 may electrically connect the active contact AC to one of the lines M1_R1, M1_R2, and M1_I of the first metal layer M1. The first via VI1 may electrically connect the gate contact GC to one of the lines M1_R1, M1_R2, and M1_I of the first metal layer M1.

A wiring line and its underlying first via VI1 of the first metal layer M1 may be formed by individual processes. For example, a wiring line and its underlying first via VI1 of the first metal layer M1 may each be formed by a single damascene process. A sub-20 nm process may be employed to fabricate a semiconductor device according to the present embodiment.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may parallel extend in the first direction D1.

The second metal layer M2 may further include second vias VI2 correspondingly provided below the second wiring lines M2_I. A wiring line of the first metal layer M1 may be electrically through the second via VI2 to a corresponding wiring line of the second metal layer M2. For example, a wiring line and its underlying second via VI2 of the second metal layer M2 may be simultaneously formed by a dual damascene process.

The first and second metal layers M1 and M2 may have their wiring lines that include the same or different conductive materials. For example, the wiring lines of the first and second metal layers M1 and M2 may include at least one metallic materials selected from aluminum, copper, tungsten, molybdenum, ruthenium, and cobalt. Although not shown, other metal layers (e.g., M3, M4, M5, etc.) may be additionally stacked on the fourth interlayer dielectric layer 140. Each of the stacked metal layers may include wiring lines for routing between cells.

With reference to FIG. 6, the following will describe in detail the inner spacer IS on the first channel pattern CH1. Referring to FIG. 6, the first source/drain pattern SD1 may include protrusions PRP that correspondingly protrude toward the first, second, and third portions PO1, PO2, and PO3 of the gate electrode GE. The protrusions PRP of the first source/drain pattern SD1 may have a first convex sidewall CSW1. The first convex sidewall CSW1 may be convex toward a corresponding one of the first, second, and third portions PO1, PO2, and PO3.

Each of the first, second, and third portions PO1, PO2, and PO3 of the gate electrode GE may each have a second convex sidewall CSW2. The second convex sidewall CSW2 may be convex toward the corresponding first convex sidewall CSW1 of the first source/drain pattern SD1.

In an embodiment, each of the first, second, and third portions PO1, PO2, and PO3 may not have a concave sidewall that corresponds to the first convex sidewall CSW1 of the first source/drain pattern SD1. This may be caused by the fact that the inner spacer IS provides an inner gate space IGE in which each of the first, second, and third portions PO1, PO2, and PO3 has the second convex sidewall CSW2.

In an embodiment, the first, second, and third portions PO1, PO2, and PO3 may have different widths from each other. For example, a maximum width in the second direction D2 of the first portion PO1 may be greater than a maximum width in the second direction D2 of the second portion PO2. The maximum width in the second direction D2 of the second portion PO2 may be greater than a maximum in the second direction D2 of the third portion PO3.

The first source/drain pattern SD1 may include a first semiconductor layer SEL1 and a second semiconductor layer SEL2 on the first semiconductor layer SEL1. In an embodiment, when the first source/drain pattern SD1 has an n-type conductivity, the first semiconductor layer SEL1 may include a semiconductor material (e.g., silicon (Si)) the same as that of the second semiconductor layer SEL2. A concentration of n-type impurities (e.g., phosphorus or arsenic) in the second semiconductor layer SEL2 may be greater than a concentration of n-type impurities in the first semiconductor layer SEL1.

In an embodiment, when the first source/drain pattern SD1 has a p-type conductivity, the first semiconductor layer SEL1 may include a semiconductor material (e.g., silicongermanium (SiGe)) the same as that of the second semiconductor layer SEL2. A concentration of germanium in the second semiconductor layer SEL2 may be greater than a concentration of germanium in the first semiconductor layer SEL1. In addition, a concentration of p-type impurities (e.g., boron) in the second semiconductor layer SEL2 may be greater than a concentration of p-type impurities in the first semiconductor layer SEL1.

The first semiconductor layer SEL1 may be in direct contact with the first, second, and third semiconductor patterns SP1, SP2, and SP3. The first semiconductor layer SEL1 may include the protrusions PRP. The first semiconductor layer SEL1 may be directly covered with the inner spacer IS which will be discussed below. In some embodiments, the first semiconductor layer SEL1 may be in direct contact with the inner spacer IS The first, second, and third portions PO1, PO2, and PO3 of the gate electrode GE may be spaced apart from the first semiconductor layer SEL1 across the inner spacer IS.

A pair of first source/drain patterns SD1 may be provided with inner regions IRG therebetween. The first, second, and third portions PO1, PO2, and PO3 of the gate electrode GE may be provided in corresponding inner regions IRG. The inner spacer IS and the high-k dielectric layer HK may further be provided in each of the inner regions IRG.

The inner spacer IS may partially fill the inner region IRG. The inner spacer IS may provide the inner gate space IGE. The inner gate space IGE may be provided therein with the high-k dielectric layer HK and a corresponding one of the first, second, and third portions PO1, PO2, and PO3.

A length in the second direction D2 of the inner region IRG may gradually decrease and then increase in the third direction D3. The inner region IRG may have a first side SI1 that is concave corresponding to the first convex sidewall CSW1.

A length in the second direction D2 of the inner gate space IGE may gradually increase and then decrease in the third direction D3. The inner gate space IGE may have a second side SI2 that is convex corresponding to the second convex sidewall CSW2.

For example, the inner spacer IS may cause the second side SI2 of the inner gate space IGE to have a profile (e.g., convex profile) opposite to a profile (e.g., concave profile) of the first side SI1 of the inner region IRG.

The following will representatively describe the second portion PO2 of the gate electrode GE and the gate dielectric layer GI that surrounds the second portion PO2. The gate dielectric layer GI may be interposed between the second portion PO2 and the first semiconductor pattern SP1, between the second portion PO2 and the second semiconductor pattern SP2, and between the second portion PO2 and the first source/drain pattern SD1.

The gate dielectric layer GI may include the inner spacer IS and the high-k dielectric layer HK. The inner spacer IS may include the first dielectric layer IL1 and the second dielectric layer IL2 on the first dielectric layer IL1. The first dielectric layer IL1 may directly cover the first semiconductor pattern SP1, the second semiconductor pattern SP2, and the first source/drain pattern SD1. In some embodiments, the first dielectric layer IL1 may directly be in contact with the first semiconductor pattern SP1, the second semiconductor pattern SP2, and the first source/drain pattern SD1 The high-k dielectric layer HK may be interposed between the inner spacer IS and the second portion PO2. The high-k dielectric layer HK may directly cover a surface of the second portion PO2 of the gate electrode GE. In some embodiments, the high-k dielectric layer HK may be in direct contact with the surface of the second portion PO2 of the gate electrode GE.

Each of the first and second dielectric layer IL1 and IL2 may include a dielectric material that contains silicon (Si). Each of the first and second dielectric layers IL1 and IL2 may include a silicon oxide layer, a silicon oxynitride layer, or a silicon nitride layer. In an embodiment, all of the first and second dielectric layers IL1 and IL2 may include a silicon oxide layer. When the first and second dielectric layers IL1 and IL2 include the same material (e.g., silicon oxide layer), no boundary may be present between the first and second dielectric layers IL1 and IL2 (unlike that shown in the example of FIG. 6). For example, the first and second dielectric layers IL1 and IL2 may be integrally connected into one silicon oxide layer that constitutes the inner spacer IS.

In an embodiment, the first dielectric layer IL1 may include a silicon nitride layer, and the second dielectric layer IL2 may include a silicon oxide layer. In this case, a distinct boundary may be found between the first and second dielectric layers IL1 and IL2 (as shown in the example of FIG. 6).

A thickness of the inner spacer IS may be a sum of thicknesses of the first and second dielectric layers IL1 and IL2. The inner spacer IS may have a first thickness TK1 as a thickness in a vertical direction that is the third direction D3. The first thickness TK1 may denote a thickness of the inner spacer IS on a top surface TSR of the high-k dielectric layer HK or on a bottom surface of the high-k dielectric layer HK. The first thickness TK1 may be less than a thickness of the high-k dielectric layer HK.

The inner spacer IS may have a second thickness TK2 as a thickness in a horizontal direction that is the second direction D2. The second thickness TK2 may denote a thickness of the inner spacer IS on a first lateral surface SSR1 of the high-k dielectric layer HK. The second thickness TK2 may be greater or less than the thickness of the high-k dielectric layer HK.

A third thickness TK3 may be defined to indicate a thickness at a corner of the inner spacer IS. The high-k dielectric layer HK may include a curved first corner COR1 between the top surface TSR and the first lateral surface SSR1. The inner spacer IS may have the third thickness TK3 on the first corner COR1 of the high-k dielectric layer HK. For example, a point FAP may be defined to indicate a position where the first source/drain pattern SD1 meets a bottom surface of the second semiconductor pattern SP2. The third thickness TK3 may be the same as a distance between the point FAP and the first corner COR1 of the high-k dielectric layer HK. The third thickness TK3 may be greater than the thickness of the high-k dielectric layer HK.

The terms such as "first", "second", "third", and so on may be used to describe a variety of elements, but the elements should not be limited by these terms. As used herein, the terms "first" and "second" may use corresponding components or elements regardless of importance or order and are used merely to distinguish one component or element from another without limiting the components or elements. The use of such ordinal numbers should not be construed as limiting the meaning of the term. For example, without departing from the scope of the present disclosure, a "first" component may be referred to as a "second" component, and similarly, the "second" component may also be referred to as a "first" component.

The inner spacer IS may include a horizontal portion TPO on the top surface TSR or the bottom surface of the high-k dielectric layer HK, a vertical portion SPO on the first lateral surface SSR1 of the high-k dielectric layer HK, and a corner portion CPO on the first corner COR1 of the high-k dielectric layer HK. The corner portion CPO may be positioned between the horizontal portion TPO and the vertical portion SPO. The horizontal portion TPO may have the first thickness TK1, the vertical portion SPO may have the second thickness TK2, and the corner portion CPO may have the third thickness TK3.

The first, second, and third thicknesses TK1, TK2, and TK3 may be different from each other. The second thickness TK2 may be greater than the first thickness TK1, and the third thickness TK3 may be greater than the second thickness TK2. A ratio (TK2/TK1) of the second thickness TK2 to the first thickness TK1 may range from about 1.5 to about 3. A ratio (TK3/TK1) of the third thickness TK3 to the first thickness TK1 may range from about 2.5 to about 5.

According to the embodiment illustrated in FIG. 6, the high-k dielectric layer HK may have a uniform thickness. In contrast, a thickness (e.g., TK2) of the vertical portion SPO of the inner spacer IS may be greater than that (e.g., TK1) of the horizontal portion TPO of the inner spacer IS. In particular, a thickness (e.g., TK3) of the corner portion CPO of the inner spacer IS may be greater than that (e.g., TK2) of the vertical portion SPO of the inner spacer IS. According to some embodiments, the inner spacer IS may have a variable thickness depending on position, and thus the inner gate space IGE may be provided to have a shape different from that of the inner region IRG.

The following will describe the fourth portion PO4 of the gate electrode GE and the gate dielectric layer GI that surrounds the fourth portion PO4. The gate dielectric layer GI may be interposed between the fourth portion PO4 and the third semiconductor pattern SP3 and between the fourth portion PO4 and the gate spacer GS. The gate dielectric layer GI may include the inner spacer IS and the high-k dielectric layer HK.

The inner spacer IS may have a fourth thickness TK4 as a thickness in a vertical direction that is the third direction D3. The fourth thickness TK4 may denote a thickness of the inner spacer IS on a bottom surface BSR of the high-k dielectric layer HK. The fourth thickness TK4 may be substantially the same as the first thickness TK1.

The inner spacer IS may have a fifth thickness TK5 as a thickness in a horizontal direction that is the second direction D2. The fifth thickness TK5 may denote a thickness of the inner spacer IS on a second lateral surface SSR2 of the high-k dielectric layer HK. The fifth thickness TK5 may be substantially the same as the second thickness TK2.

The inner spacer IS may have a sixth thickness TK6 at a corner thereof. The high-k dielectric layer HK may include a curved second corner COR2 between the bottom surface TSR and the second lateral surface SSR2. The sixth thickness TK6 may denote a thickness of the inner spacer IS on the second corner COR2 of the high-k dielectric layer HK. The sixth thickness TK6 may be the same as a distance between the second corner COR2 and a position where the third semiconductor pattern SP3 meets the gate spacer GS. The sixth thickness TK6 may be substantially the same as the third thickness TK3.

The inner spacer IS may include a horizontal portion TPO on the top surface TSR or the bottom surface of the high-k dielectric layer HK, a vertical portion SPO on the first lateral surface SSR1 of the high-k dielectric layer HK, and a corner portion CPO on the first corner COR1 of the high-k dielectric layer HK. The corner portion CPO may be positioned between the horizontal portion TPO and the vertical portion SPO. The horizontal portion TPO may have the first thickness TK1, the vertical portion SPO may have the second thickness TK2, and the corner portion CPO may have the third thickness TK3.

The first, second, and third thicknesses TK1, TK2, and TK3 may be different from each other. The second thickness TK2 may be greater than the first thickness TK1, and the third thickness TK3 may be greater than the second thickness TK2. A ratio (TK2/TK1) of the second thickness TK2 to the first thickness TK1 may range from about 1.5 to about 3. A ratio (TK3/TK1) of the third thickness TK3 to the first thickness TK1 may range from about 2.5 to about 5.

According to the embodiment illustrated in FIG. 6, the high-k dielectric layer HK may have a uniform thickness. In contrast, a thickness (e.g., TK2) of the vertical portion SPO of the inner spacer IS may be greater than that (e.g., TK1) of the horizontal portion TPO of the inner spacer IS. In particular, a thickness (e.g., TK3) of the corner portion CPO of the inner spacer IS may be greater than that (e.g., TK2) of the vertical portion SPO of the inner spacer IS. According to some embodiments, the inner spacer IS may have a variable thickness depending on position, and thus the inner gate space IGE may be provided to have a shape different from that of the inner region IRG.

The inner spacer IS shown in FIG. 6 may be applicable to NMOSFET and PMOSFET as well. In an embodiment, the inner spacer IS of FIG. 6 may be applicable to only NMOSFET, and not to PMOSFET. In another embodiment, the inner spacer IS may be applicable to only PMOSFET, and not to NMOSFET. In another embodiment, the inner spacer IS may be applicable to all of PMOSFET and NMOSFET.

According to some embodiments, the second thickness TK2 of the vertical portion SPO of the inner spacer IS may be greater than the first thickness TK1 of the horizontal portion TPO of the inner spacer IS, and thus it may be possible to reduce leakage current of transistors. Moreover, a leakage current may be effectively reduced by causing the inner spacer IS to have a greatly increased third thickness TK3, at the corner portion CPO vulnerable to the leakage current. In addition, a relatively small capacitance may be provided between the first source/drain pattern SD1 and the first, second, and third portions PO1, PO2, and PO3 of the gate electrode GE by causing the inner spacer IS to have a significantly increased thickness only at the corner portion CPO. As a result, according to various embodiments, a thickness of the inner spacer IS may be selectively increased to improve electrical properties of semiconductor devices.

FIGS. 7A to 12C illustrate cross-sectional views showing a method of fabricating a semiconductor device according to some embodiments. FIGS. 7A, 8A, 9A, 10A, 11A, and 12A show cross-sectional views taken along line A-A' of FIG. 4. FIGS. 9B, 10B, 11B, and 12B show cross-sectional views taken along line C-C' of FIG. 4. FIGS. 7B, 8B, 9C, 10C, 11C, and 12C show cross-sectional views taken along line D-D' of FIG. 4.

Figure 7A:
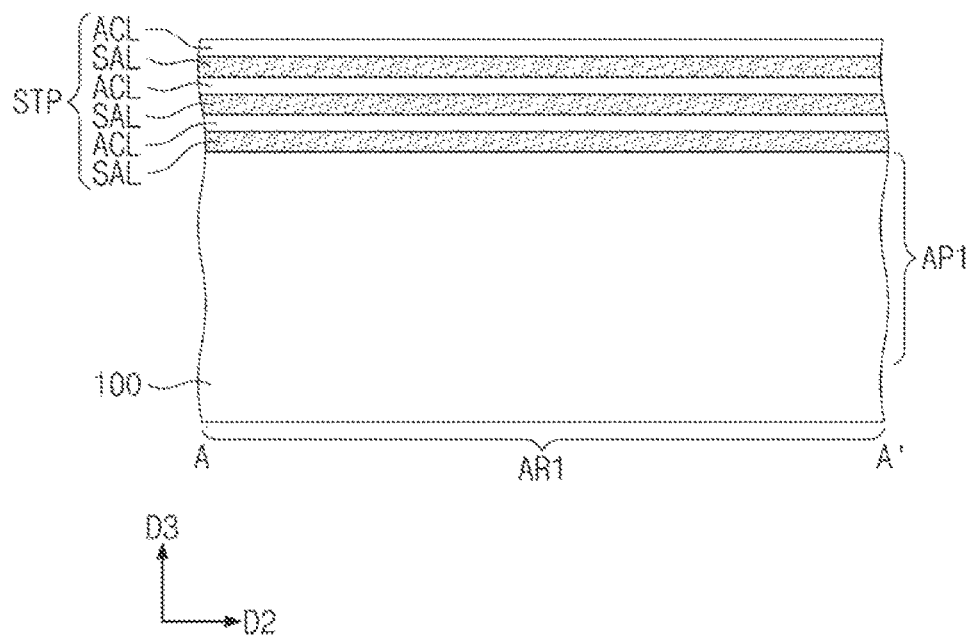
FIGS. 7A to 12C illustrate cross-sectional views showing a method of fabricating a semiconductor device according to some embodiments.
Figure 7B:
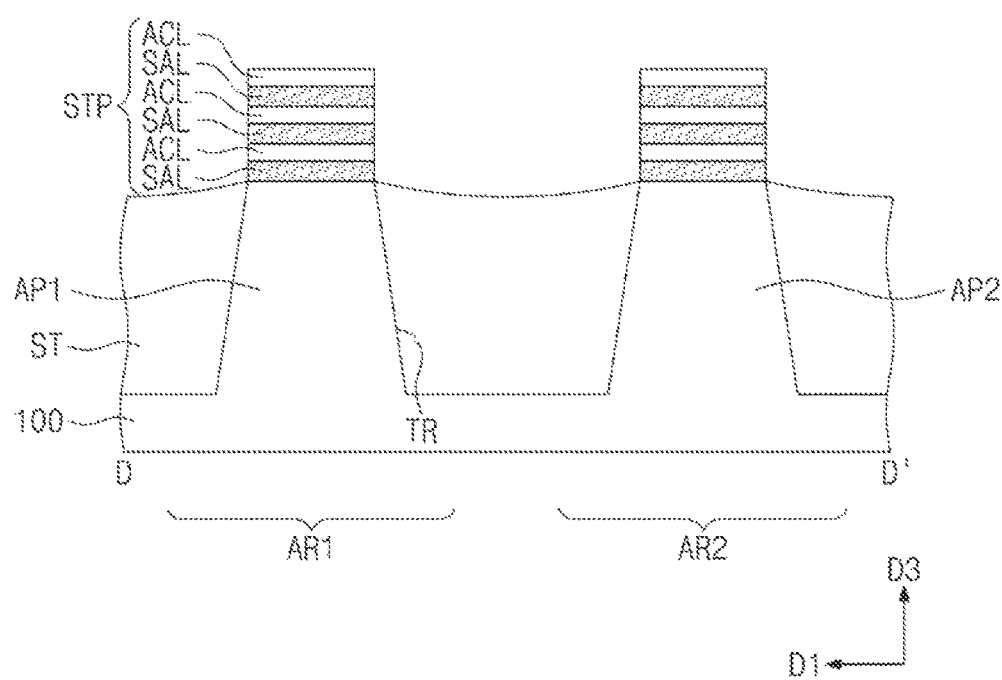

Referring to FIGS. 7A and 7B, a substrate 100 may be provided which includes first and second active regions AR1 and AR2. There may be formed active layers ACL and sacrificial layers SAL that are alternately stacked on the substrate 100. The active layers ACL may include one of silicon (Si), germanium (Ge), and silicon-germanium (SiGe), and the sacrificial layers SAL may include another of silicon (Si), germanium (Ge), and silicon-germanium (SiGe). For example, in some embodiments, when the active layers ACL include silicon (Si), the sacrificial layers SAL may include one of germanium (Ge), and silicon-germanium (SiGe). In other embodiments, when the active layers ACL include silicon-germanium (SiGe), the sacrificial layers SAL may include one of silicon (Si) and germanium (Ge). In still other embodiments, when the active layers ACL include germanium (Ge), the sacrificial layers SAL may include one of silicon (Si) and silicon-germanium (SiGe).

The sacrificial layer SAL may include a material having an etch selectivity with respect to the active layer ACL. For example, the active layers ACL may include silicon (Si), and the sacrificial layers SAL may include silicon-germanium (SiGe). Each of the sacrificial layers SAL may have a germanium concentration of about 10 at % to about 30 at %.

Mask patterns may be formed on the first and second active regions AR1 and AR2 of the substrate 100. The mask patterns may each have a linear or bar shape that extends in a second direction D2.

A patterning process may be performed in which the mask patterns are used as an etching mask to form a trench TR that defines a first active pattern AP1 and a second active pattern AP2, and corresponding stack patterns STP. The first active pattern AP1 may be formed on the first active region AR1. The second active pattern AP2 may be formed on the second active region AR2.

The stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the first and second active patterns AP1 and AP2 and the stack patterns STP. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwards from the device isolation layer ST.

Figure 8A:
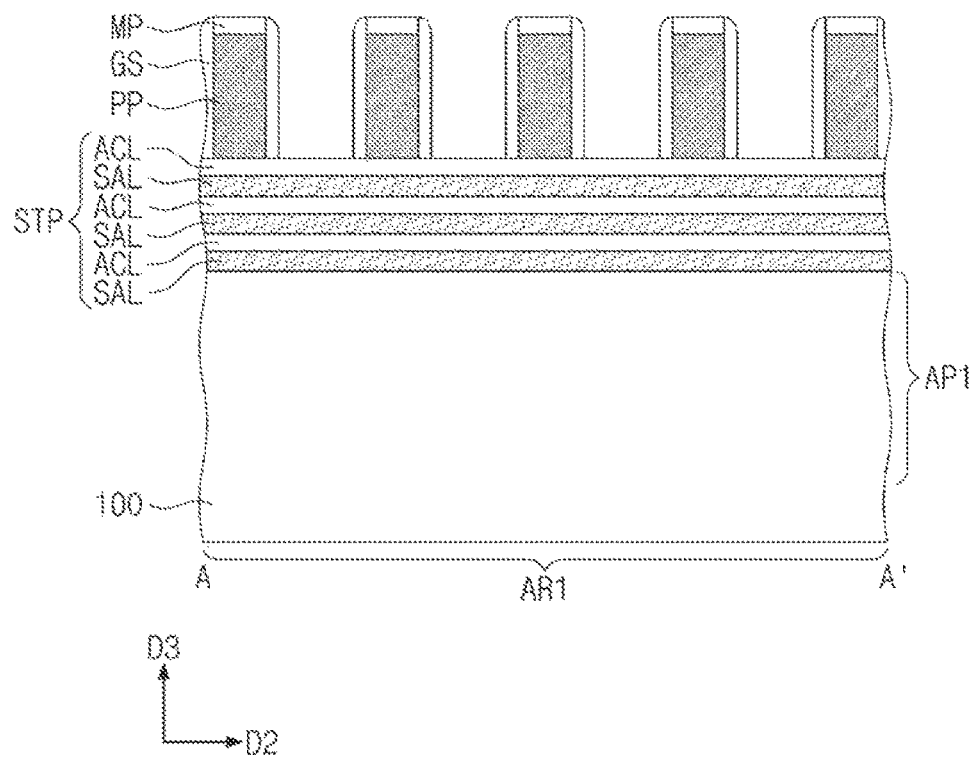
Figure 8B:
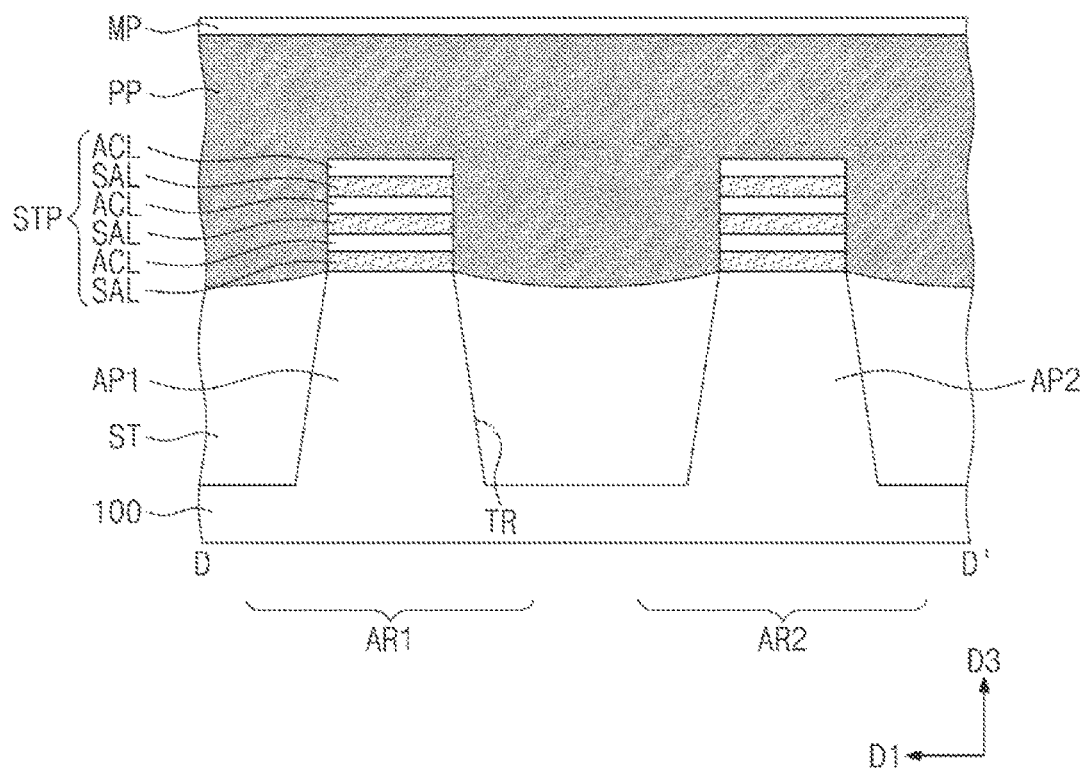

Referring to FIGS. 8A and 8B, sacrificial patterns PP may be formed on the substrate 100 to run across the stack patterns STP. Each of the sacrificial patterns PP may be formed to have a linear or bar shape that extends in a first direction D1. The sacrificial patterns PP may be arranged along the second direction D2 at a first pitch.

For example, the formation of the sacrificial patterns PP may include forming a sacrificial layer on an entire surface of the substrate 100, forming hardmask patterns MP on the sacrificial layer, and using the hardmask patterns MP as an etching mask to pattern the sacrificial layer. The sacrificial layer may include polysilicon.

A pair of gate spacers GS may be formed each of the sacrificial patterns PP. In some embodiments, a gate spacer GS may be formed on each sidewall of each of the sacrificial patterns PP, as illustrated in FIG. 8A. The formation of the gate spacers GS may include conformally forming a gate spacer layer on the entire surface of the substrate 100 and anisotropically etching the gate spacer layer. In an embodiment, the gate spacer GS may have a multi-layered structure including at least two layers.

Figure 9A:
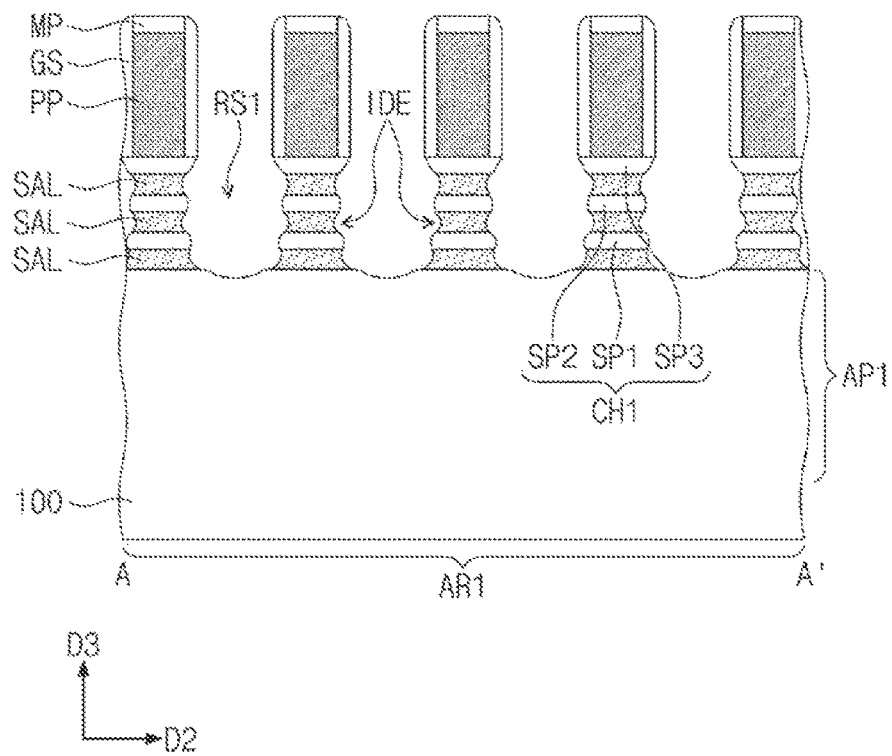
Figure 9B:
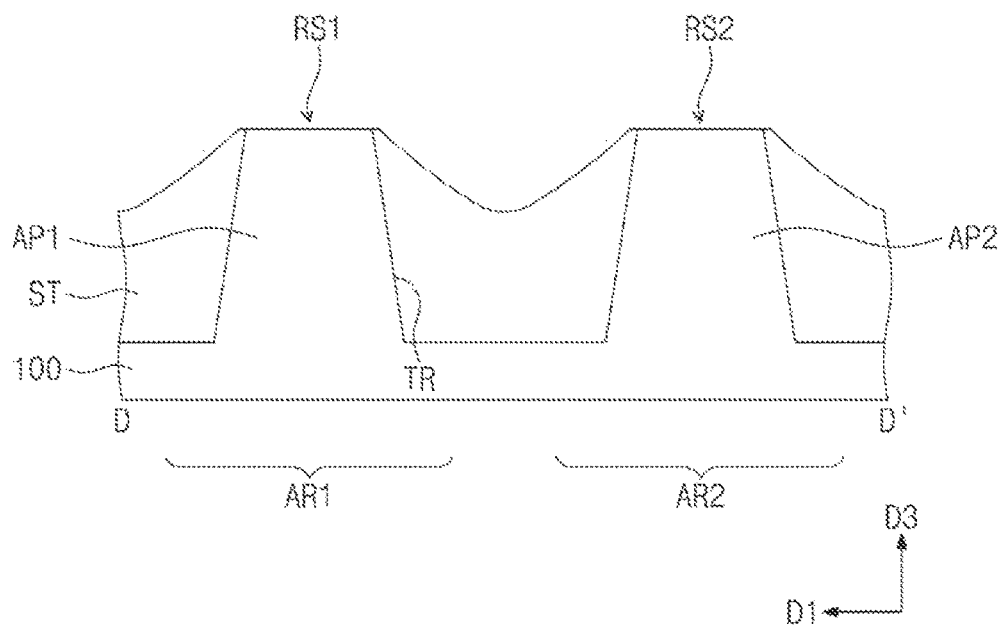
Figure 9C:
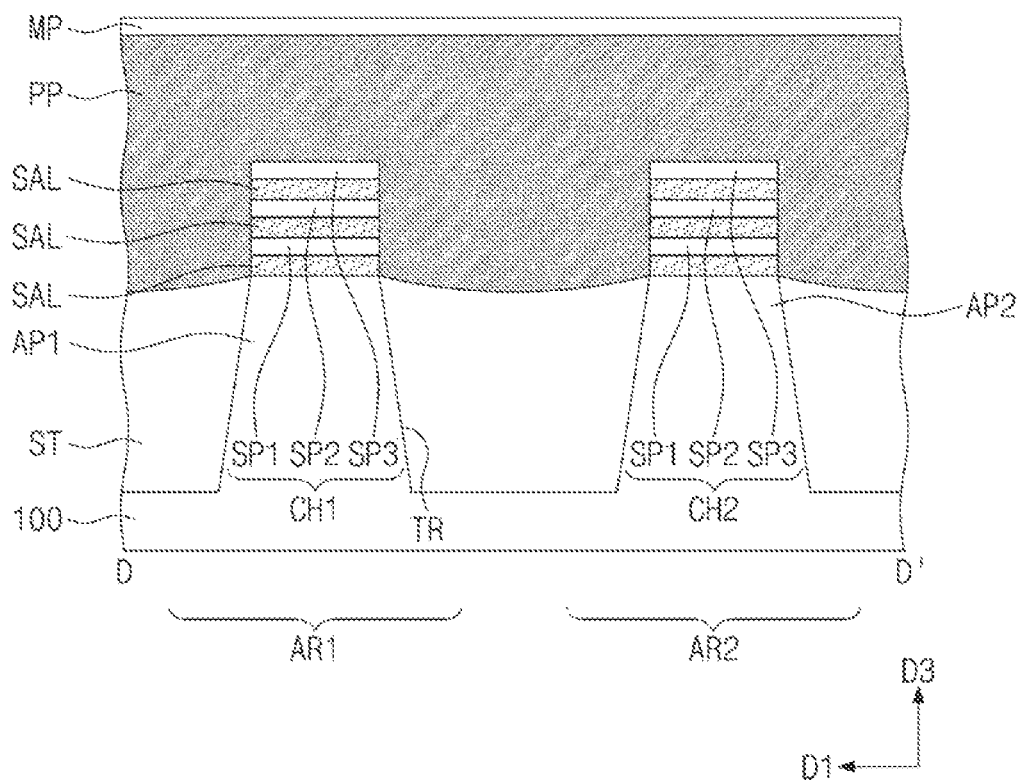

Referring to FIGS. 9A to 9C, first recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST may be more recessed on both sides of each of the first and second active patterns AP1 and AP2 (see FIG. 9B).

For example, the hardmask patterns MP and the gate spacers GS may be used as an etching mask to etch the stack pattern STP on the first active pattern AP1, thereby forming the first recesses RS1. The first recess RS1 may be formed between a pair of sacrificial patterns PP. The formation of the first recess RS1 may include additionally performing a selective etching process on exposed sacrificial layers SAL. The selective etching process may cause the each of the sacrificial layers SAL to be indented to form an indent region IDE. Therefore, the first recess RS1 may have a wave-shaped inner sidewall. The second recesses RS2 in the stack pattern STP on the second active pattern AP2 may be formed by the same method used for the formation of the first recesses RS1, and thus repeated description thereof is omitted for conciseness.

The active layers ACL may be formed into first, second, and third semiconductor patterns SP1, SP2, and SP3 that are sequentially stacked between neighboring first recesses RS1. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2.

Figure 10A:
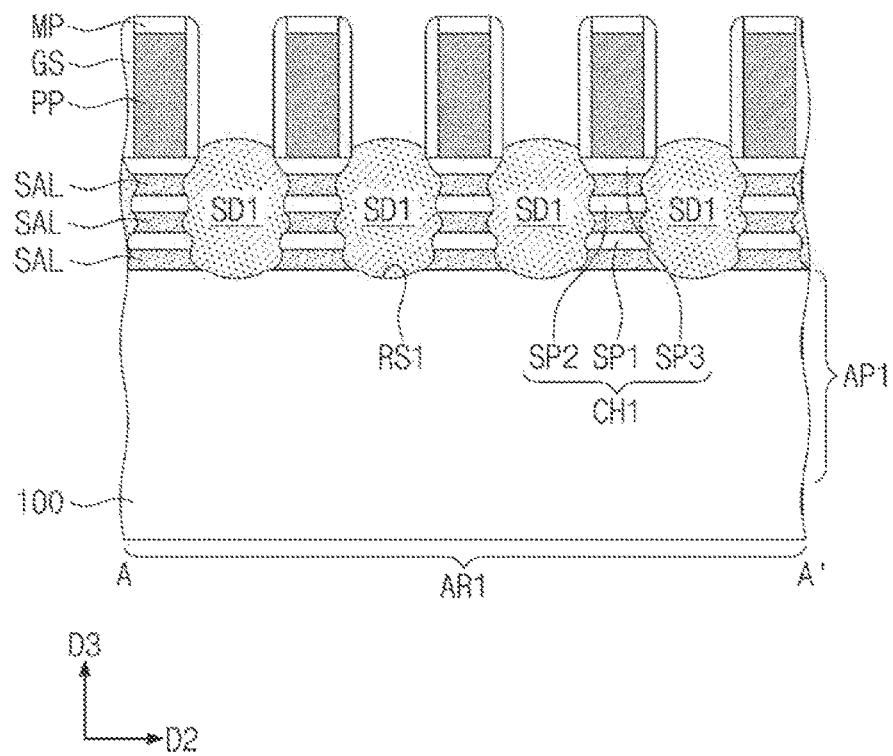
Figure 10B:
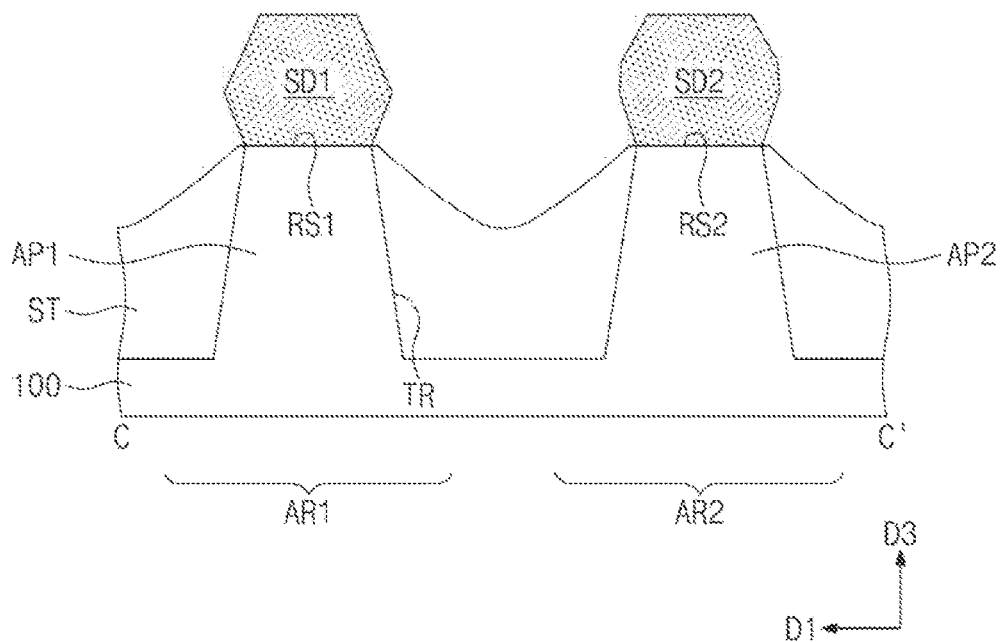
Figure 10C:
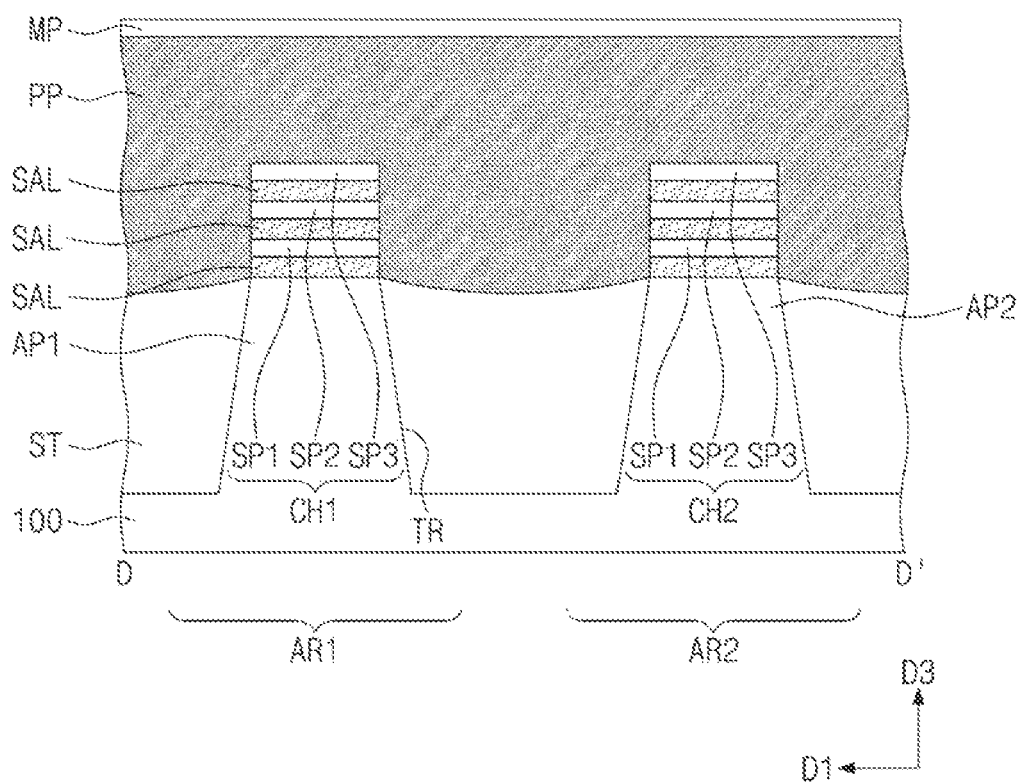

Referring to FIGS. 10A to 10C, first source/drain patterns SD1 may be correspondingly formed in the first recesses RS1. For example, a selective epitaxial growth (SEG) process may be performed in which an inner wall of the first recess RS1 is used as a seed layer to form an epitaxial layer that fills the first recess RS1. The epitaxial layer may be grown from a seed, or from the first, second, and third semiconductor patterns SP1, SP2, and SP3 and the substrate 100 that are exposed by the first recess RS1. For example, the SEG process may include chemical vapor deposition (CVD) or molecular beam epitaxy (MBE).

In an embodiment, the first source/drain pattern SD1 may include a semiconductor element (e.g., Si) the same as that of the substrate 100. During the formation of the first source/drain pattern SD1, impurities (e.g., phosphorus, arsenic, or antimony) may be in-situ implanted to cause the first source/drain pattern SD1 to have an n-type conductivity. Alternatively or additionally, after the formation of the first source/drain pattern SD1, impurities may be implanted into the first source/drain pattern SD1.

Second source/drain patterns SD2 may be correspondingly formed in the second recesses RS2. For example, a selective epitaxial growth (SEG) process may be performed in which an inner sidewall of the second recess RS2 is used as a seed layer to form the second source/drain pattern SD2.

In an embodiment, the second source/drain pattern SD2 may include a semiconductor element (e.g., SiGe) whose lattice constant is greater than that of a semiconductor element of the substrate 100. During the formation of the second source/drain pattern SD2, impurities (e.g., boron, gallium, or indium) may be in-situ implanted to cause the second source/drain pattern SD2 to have a p-type conductivity. Alternatively or additionally, after the formation of the second source/drain pattern SD2, impurities may be implanted into the second source/drain pattern SD2.

Figure 11A:
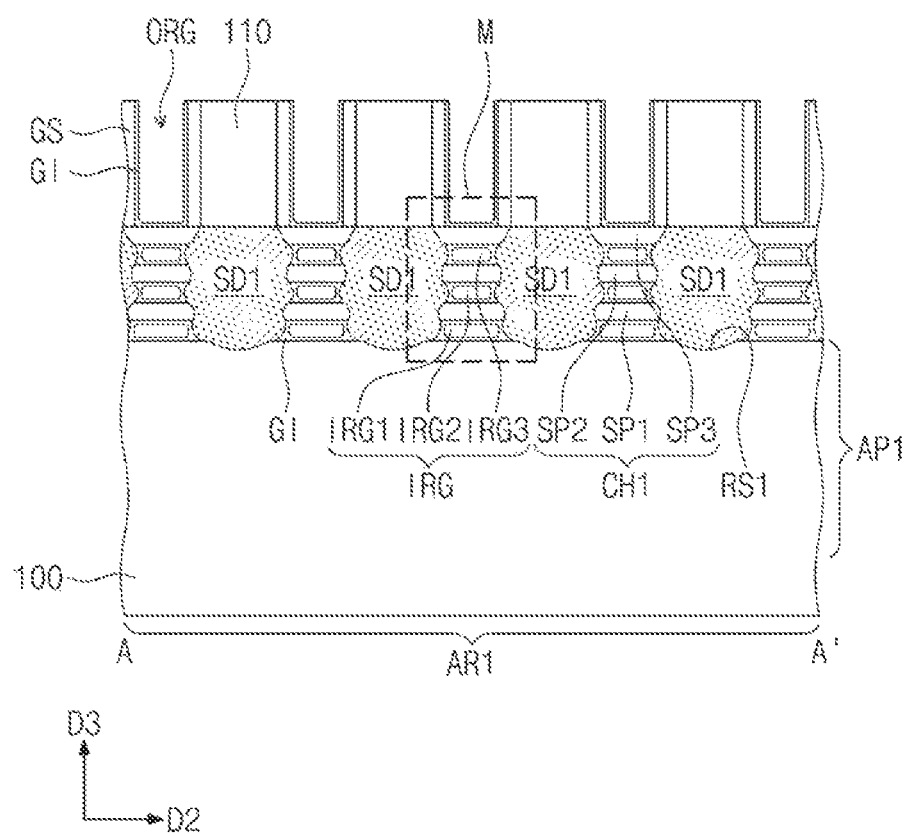
Figure 11B:
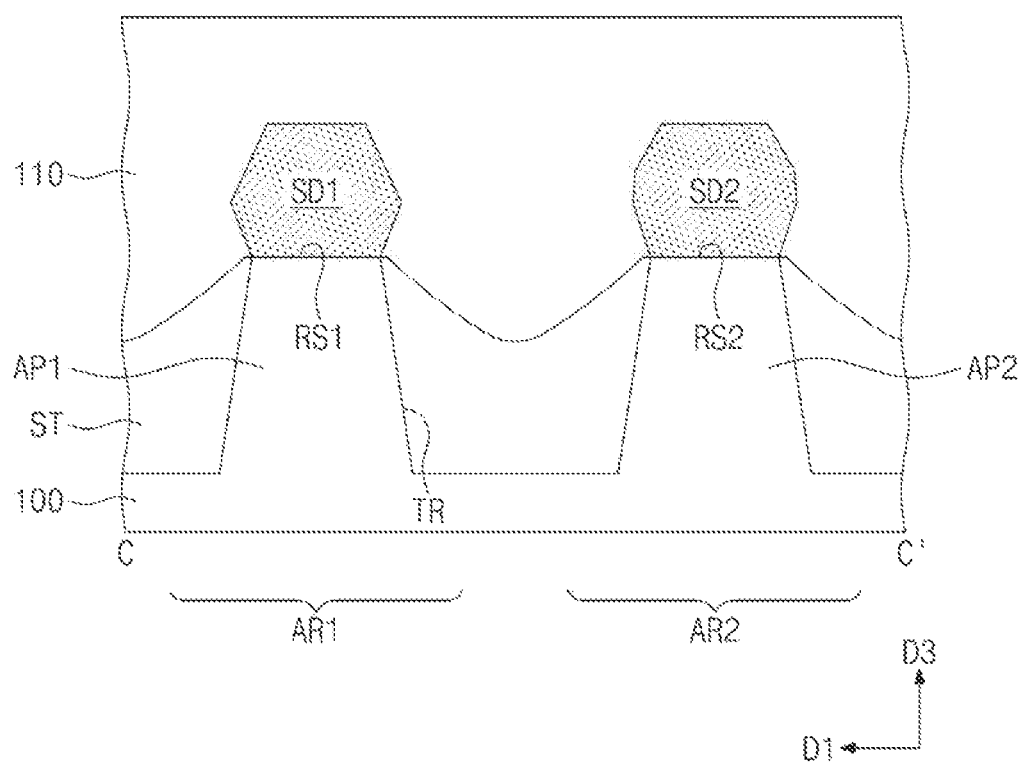
Figure 11C:
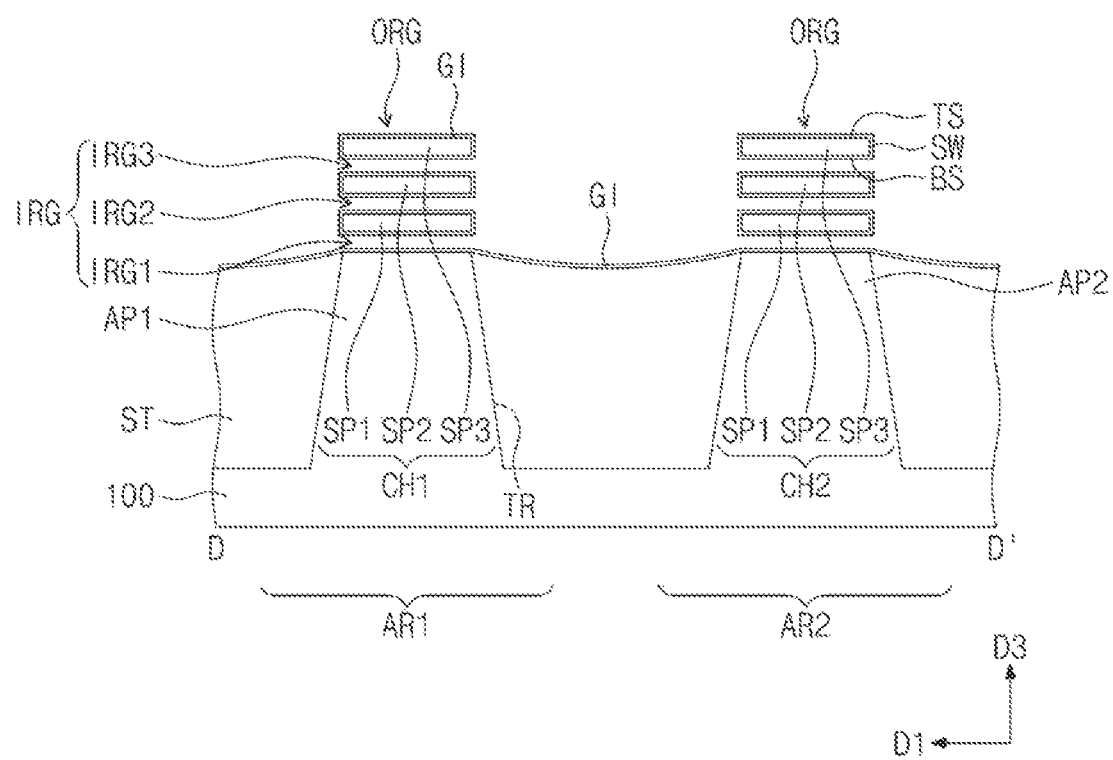
Figure 12A:
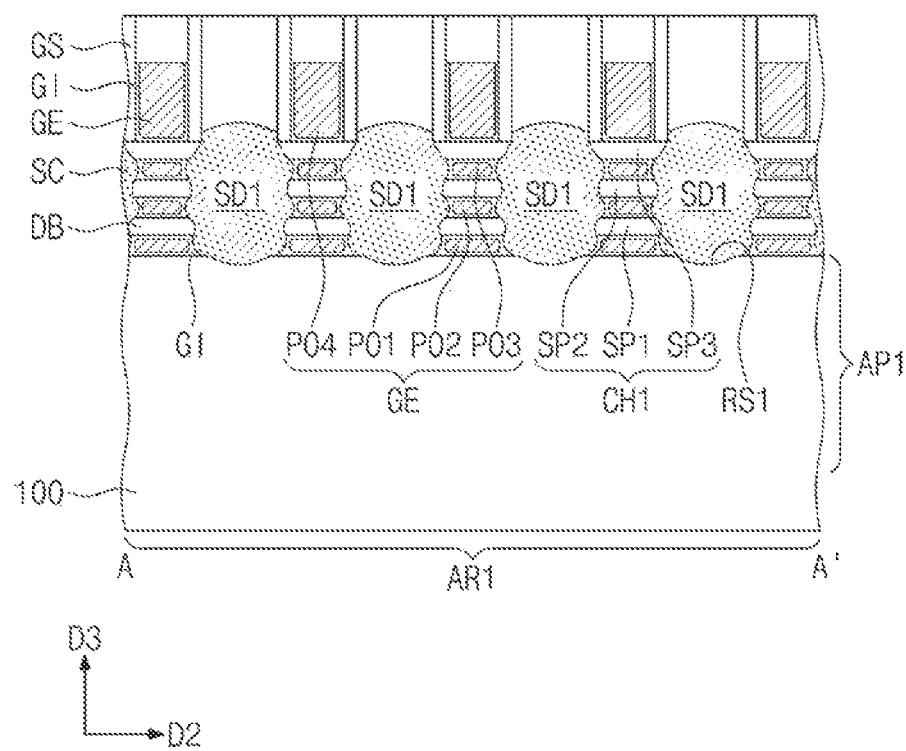
Figure 12B:
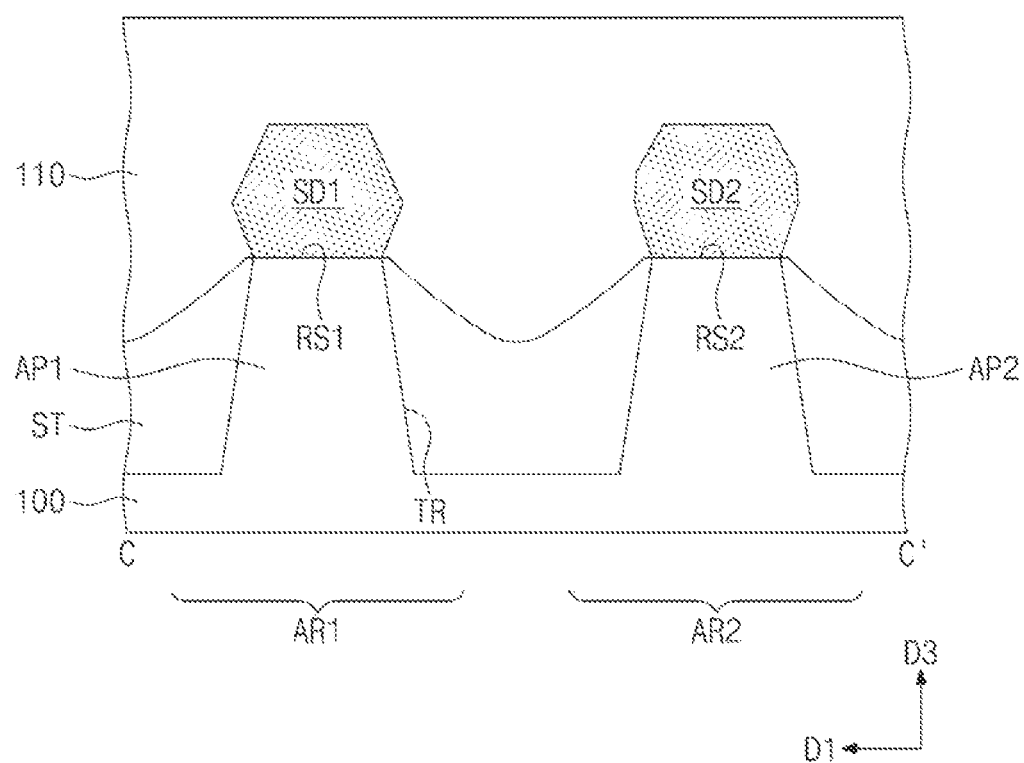
Figure 12C:
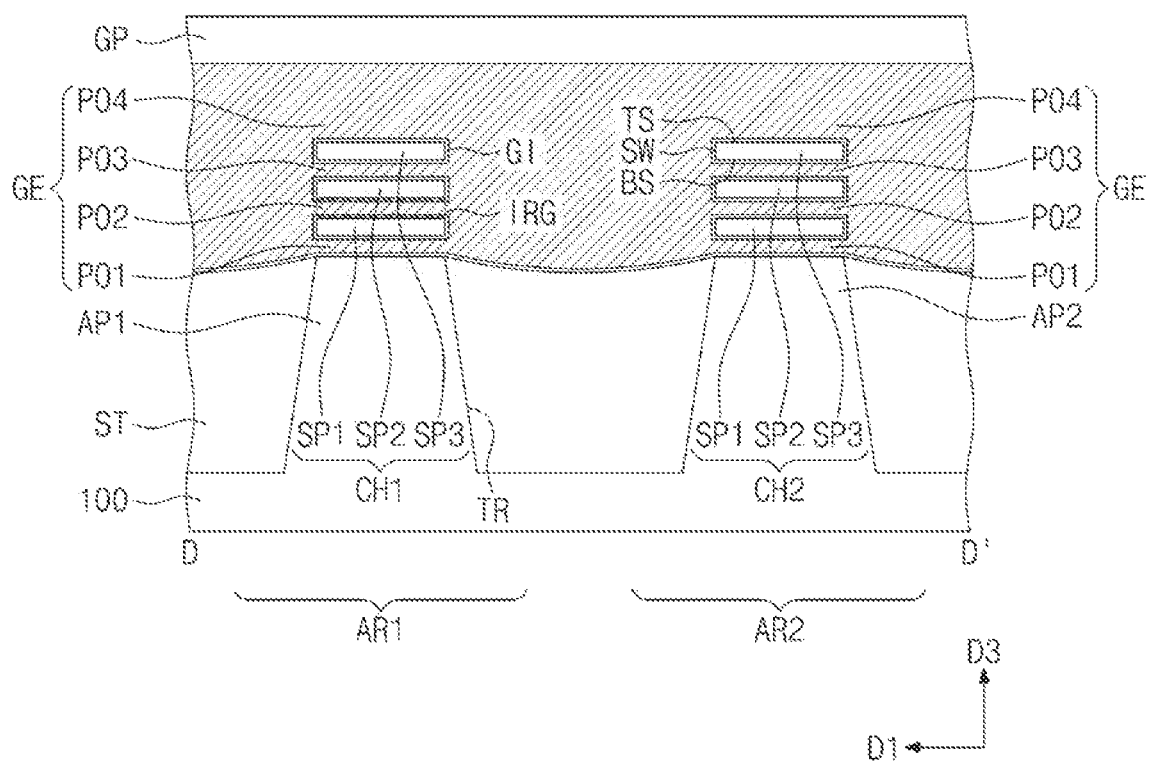

Referring to FIGS. 11A to 11C, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be performed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form outer regions ORG that expose the first and second channel patterns CH1 and CH2 (see FIG. 11C). The removal of the sacrificial patterns PP may include performing a wet etching process using an etchant that selectively etches polysilicon.

The sacrificial layers SAL exposed through the outer region ORG may be selectively removed to form inner regions IRG (see FIG. 11C). For example, an etching process that selectively etches the sacrificial layers SAL may be performed to remove only the sacrificial layers SAL while leaving the first, second, and third semiconductor patterns SP1, SP2, and SP3. The etching process may have a high etch rate for silicon-germanium whose germanium concentration is relatively high. For example, the etching process may have a high etch rate with respect to silicon-germanium whose germanium concentration is greater than about 10 at %.

The etching process may remove the sacrificial layers SAL on the first and second active regions AR1 and AR2. The etching process may be a wet etching process. The etching material used for the etching process may promptly etch the sacrificial layer SAL whose germanium concentration is relatively high.

Referring back to FIG. 11C, because the sacrificial layers SAL are selectively removed, only the first, second, and third semiconductor patterns SP1, SP2, and SP3 may remain on each of the first and second active patterns AP1 and AP2. The removal of the sacrificial layers SAL may form a first inner region IRG1, a second inner region IRG2, and a third inner region IRG3.

For example, the first inner region IRG1 may be formed between the first semiconductor pattern SP1 and one of the first and second active patterns AP1 and AP2, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring again to FIGS. 11A to 11C, a gate dielectric layer GI may be formed on the exposed first, second, and third semiconductor patterns SP1, SP2, and SP3. The gate dielectric layer GI may surround each of the first, second, and third semiconductor patterns SP1, SP2, and SP3. The gate dielectric layer GI may be formed in each of the first, second, and third inner regions IRG1, IRG2, and IRG3. The gate dielectric layer GI may be formed in the outer region ORG.

Figure 13:
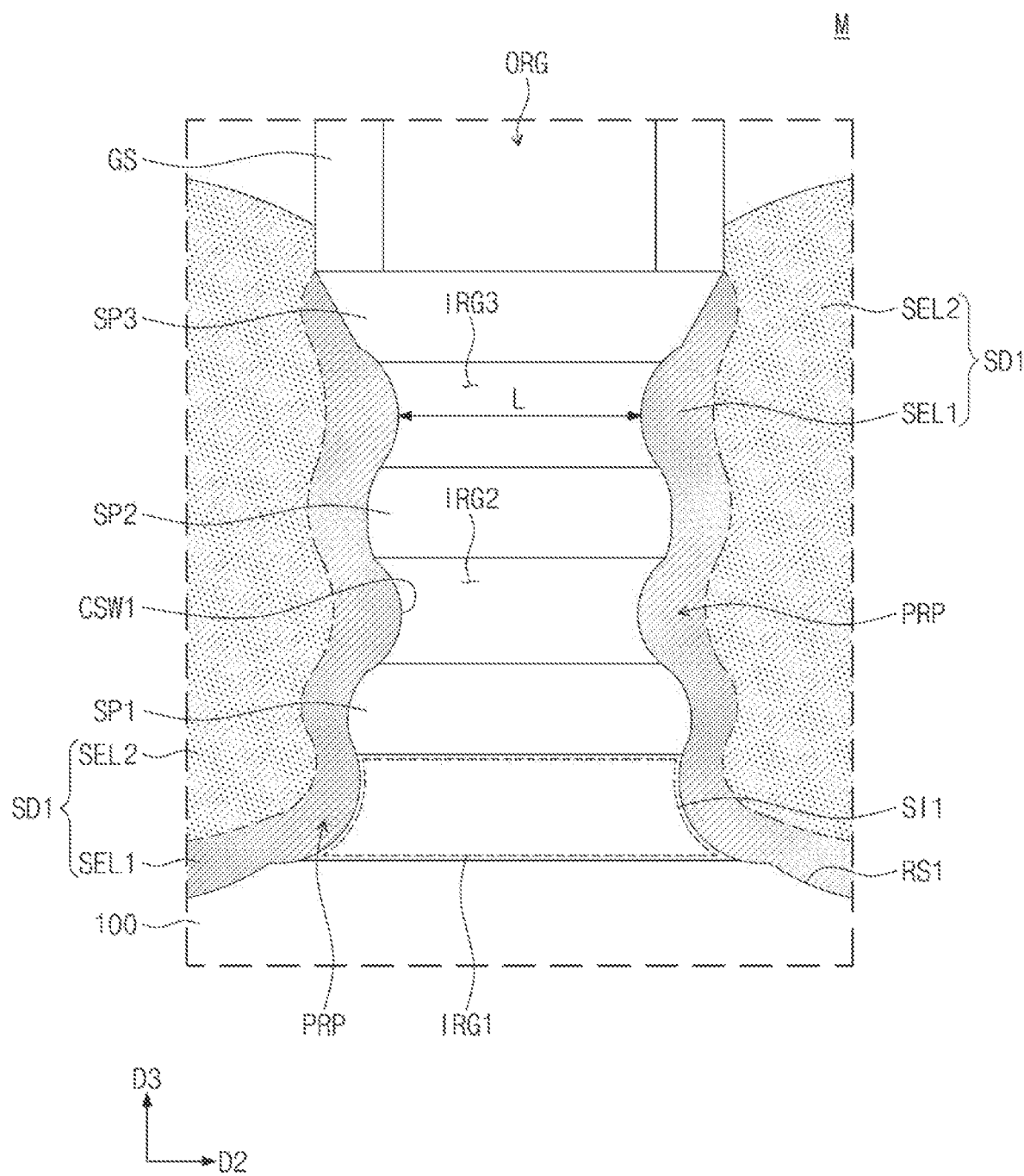
FIGS. 13 to 17 illustrate enlarged views showing a method of forming section M depicted in FIG. 11A.

FIGS. 13 to 17 illustrate enlarged views showing a method of forming section M depicted in FIG. 11A. Referring to FIG. 13, as discussed above, the sacrificial pattern PP may be selectively removed to form the outer region ORG. The sacrificial layers SAL exposed through the outer region ORG may be selectively removed to form first to third inner regions IRG1 to IRG3. Each of the first to third inner regions IRG1 to IRG3 may be positioned between a pair of first source/drain patterns SD1.

The indent region IDE shown in FIG. 9A may allow the first source/drain pattern SD1 to include protrusions PRP. The protrusion PRP may have a first convex sidewall CSW1. For example, the second inner region IRG2 may expose the first convex sidewall CSW1 of the first source/drain pattern SD1. The second inner region IRG2 may expose a top surface of the first semiconductor pattern SP1 and a bottom surface of the second semiconductor pattern SP2.

A length L in the second direction D2 of each of the first to third inner regions IRG1 to IRG3 may gradually decrease and then increase as a distance from the substrate 100 in the third direction D3 increases. Each of the first, second, and third inner regions IRG1, IRG2, and IRG3 may have a first side SI1 that is concave corresponding to the first convex sidewall CSW1.

Figure 14:
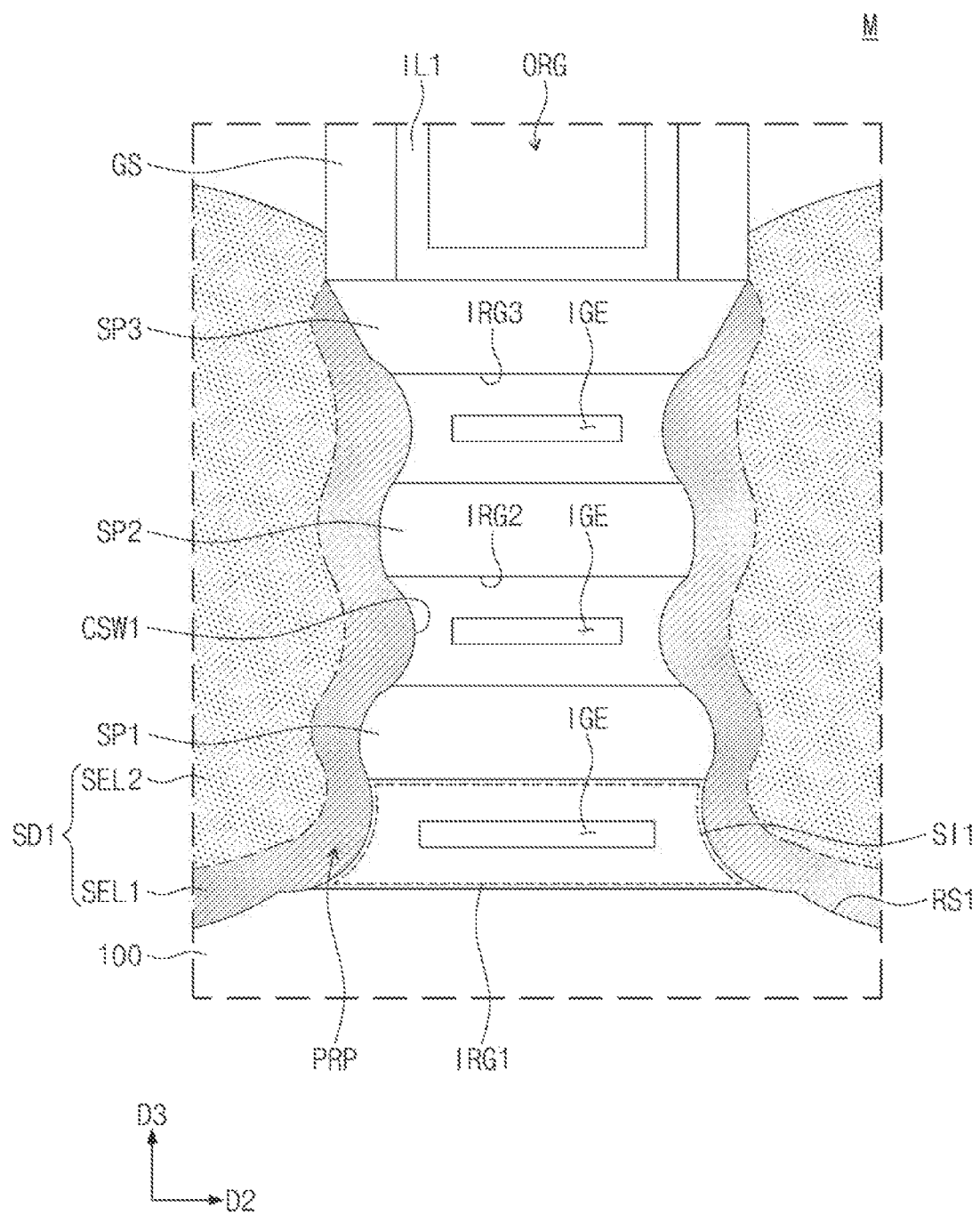

Referring to FIG. 14, a first dielectric layer IL1 may be conformally formed in the first to third inner regions IRG1 to IRG3 and the outer region ORG. The first dielectric layer IL1 may be formed by a deposition process such as atomic layer deposition (ALD) or chemical vapor deposition (CVD). The first dielectric layer IL1 may be formed to partially fill the first to third inner regions IRG1 to IRG3 without completely filling the first to third inner regions IRG1 to IRG3. Therefore, the first dielectric layer IL1 may define an inner gate space IGE in each of the first to third inner regions IRG1 to IRG3. For example, the first dielectric layer IL1 may include a silicon oxide layer, a silicon oxynitride layer, or a silicon nitride layer.

Figure 15:
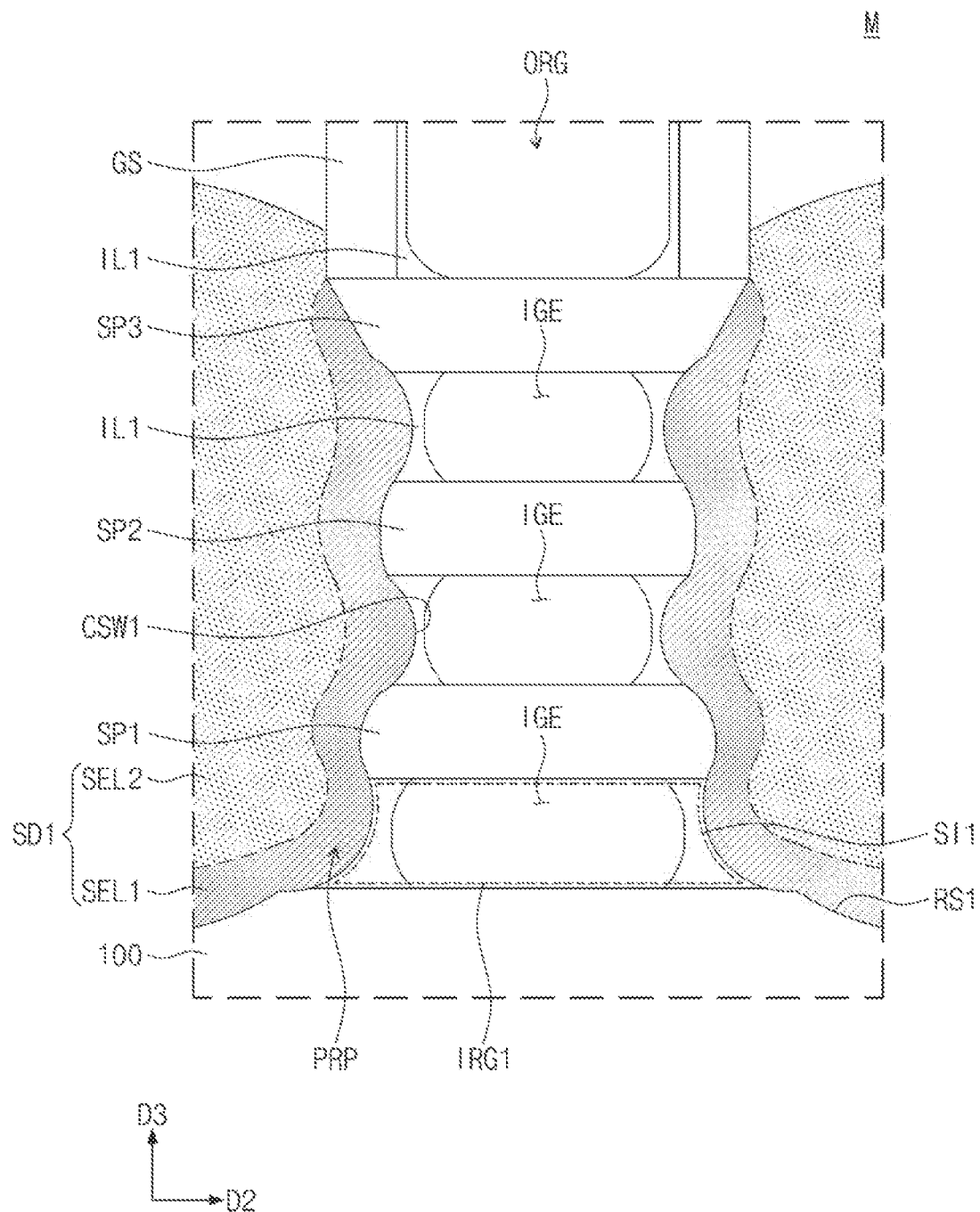

Referring to FIG. 15, the first dielectric layer IL1 may be partially and selectively etched. The etching of the first dielectric layer IL1 may include performing a wet etching process using an etching solution that selectively etches only the first dielectric layer IL1. For example, an etching material may be provided through the inner gate space IGE to etch the first dielectric layer IL1. In an embodiment, the etching process may continue until surfaces of the first, second, and third semiconductor patterns SP1, SP2, and SP3 are exposed, as illustrated in FIG. 15.

After the etching process, the first dielectric layer IL1 may remain on a surface of the first source/drain pattern SD1. For example, a relatively large amount of the first dielectric layer IL1 may remain in spaces between the first source/drain pattern SD1 and the first to third semiconductor patterns SP1 to SP3. The remaining first dielectric layer IL1 may provide the inner gate space IGE that expands more than that of FIG. 14. In other words, the etching process may enlarge the inner gate space IGE from the size illustrated in FIG. 14 to the size illustrated in FIG. 15.

Figure 16:
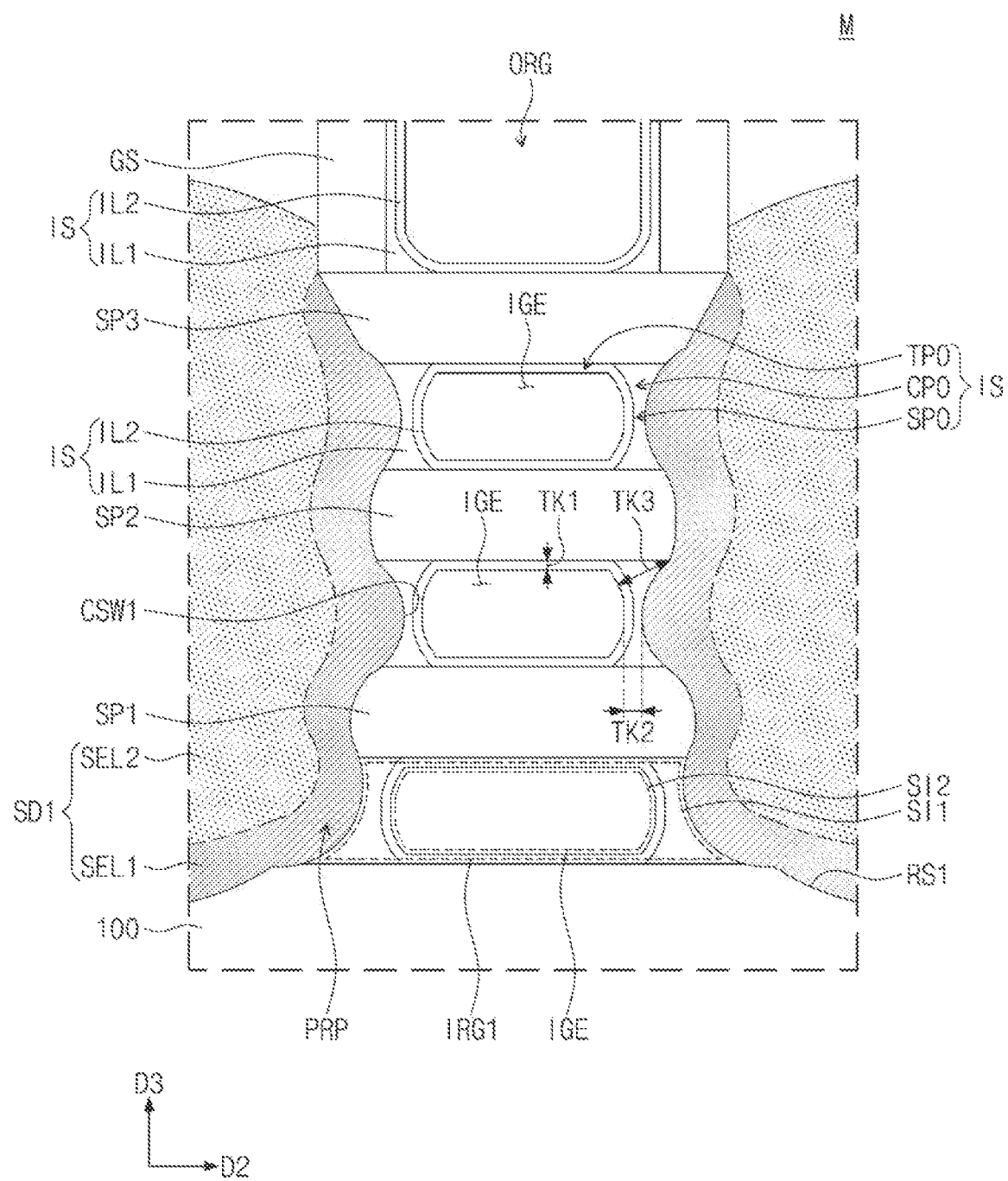

Referring to FIG. 16, a second dielectric layer IL2 may be conformally formed in the first to third inner regions IRG1 to IRG3 and the outer region ORG. The second dielectric layer IL2 may be formed on the first dielectric layer IL1. For example, the second dielectric layer IL2 may include a silicon oxide layer, a silicon oxynitride layer, or a silicon nitride layer. The first dielectric layer IL1 and the second dielectric layer IL2 may constitute an inner spacer IS.

The inner spacer IS may include a horizontal portion TPO on one of the first to third semiconductor patterns SP1 to SP3, a vertical portion SPO on the first convex sidewall CSW1 of the first source/drain pattern SD1, and a corner portion CPO between the horizontal portion TPO and the vertical portion SPO. The horizontal portion TPO may have a first thickness TK1, the vertical portion SPO may have a second thickness TK2, and the corner portion CPO may have a third thickness TK3 as illustrated in FIG. 16. The second thickness TK2 may be greater than the first thickness TK1, and the third thickness TK3 may be greater than the second thickness TK2.

The inner spacer IS in each of the first to third inner regions IRG1 to IRG3 may define an inner gate space IGE. A first side SI1 of each of the first to third inner regions IRG1 to IRG3 may be concave, and a second side SI2 of the inner gate space IGE may be convex. As the corner portion CPO of the inner spacer IS is formed relatively thick as compared with the horizontal portion TPO and the vertical portion SPO, the second side SI2 of the inner gate space IGE may be convex opposite to the first side SI1 of each of the first to third inner regions IRG1 to IRG3.

Figure 17:
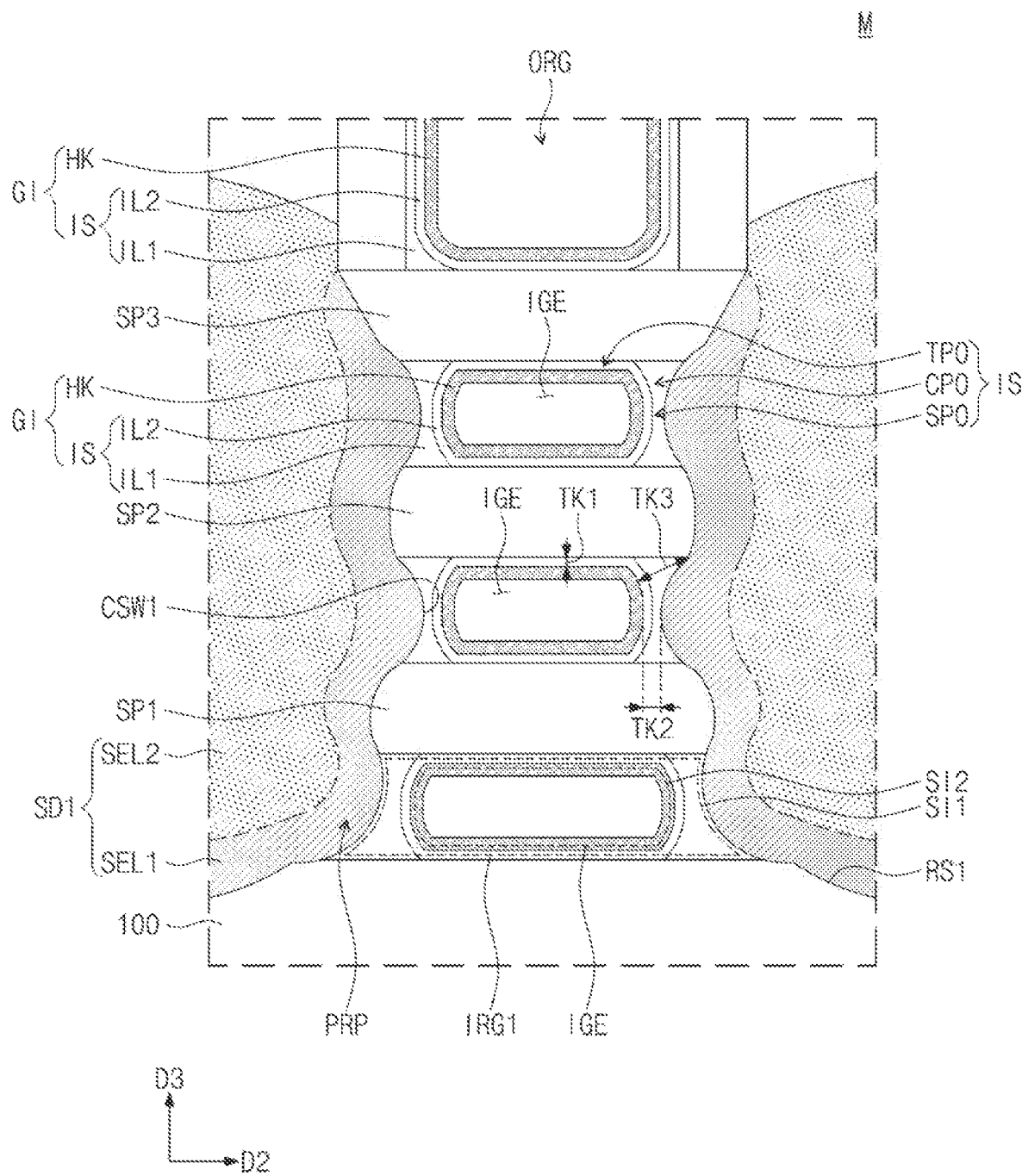

Referring to FIG. 17, a high-k dielectric layer HK may be formed in the outer region ORG and the first to third inner regions IRG1 to IRG3. A high-k dielectric layer HK may be formed in the inner gate space IGE. The inner spacer IS and the high-k dielectric layer HK may constitute a gate dielectric layer GI.

In an embodiment, the high-k dielectric layer HK may be conformally formed. For example, a thickness in a horizontal direction of the high-k dielectric layer HK may be substantially the same as a thickness in a vertical direction of the high-k dielectric layer HK.

According to the various embodiments, because the horizontal portion TPO of the inner spacer IS has a relatively small thickness TK1, each of the first, second, and third inner regions IRG1, IRG2, and IRG3 may be provided therein with the inner gate space IGE that is a space sufficiently filled with a gate electrode GE which will be discussed below. In the various embodiments, the vertical portion SPO and the corner portion CPO may be formed to have relatively large thicknesses TK2 and TK3, respectively, compared to the first thickness TK1 and thus it may be possible to reduce a leakage current of transistors and to improve electrical properties of devices.

Referring back to FIGS. 12A to 12C, a gate electrode GE may be formed on the gate dielectric layer GI. The gate electrode GE may include first, second, and third portions PO1, PO2, and PO3 correspondingly formed in the first, second, and third inner regions IRG1, IRG2, and IRG3, and may also include a fourth portion PO4 formed in the outer region ORG. The first, second, and third portions PO1, PO2, and PO3 may fill corresponding inner gate spaces IGE of FIG. 17. The gate electrode GE may be recessed to have a reduced height. A gate capping pattern GP may be formed on the recessed gate electrode GE.

Referring back to FIGS. 5A to 5D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to electrically connect to the first and second source/drain patterns SD1 and SD2. A gate contact GC may be formed to penetrate the second interlayer dielectric layer 120 and the gate capping pattern GP and to electrically connect to the gate electrode GE.

The formation of the active contact AC and the gate contact GC may include forming a barrier pattern BM and a conductive pattern FM on the barrier pattern BM. The barrier pattern BM may be conformally formed and may include a metal layer and a metal nitride layer. The conductive pattern FM may include low-resistance metal.

Separation structures DB may be formed on the first and second boundaries BD1 and BD2 (see FIG. 4) of the single height cell SHC. The separation structure DB may extend from the second interlayer dielectric layer 120 through the gate electrode GE into the active pattern AP1 or AP2 (see, e.g., FIG. 5A). The separation structure DB may include a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

The following will discuss various embodiments. In the embodiments that follow, a detailed description of technical features repetitive to those discussed above with reference to FIGS. 1 to 6 will be omitted for conciseness, and a difference thereof will be discussed in detail.

Figure 18:
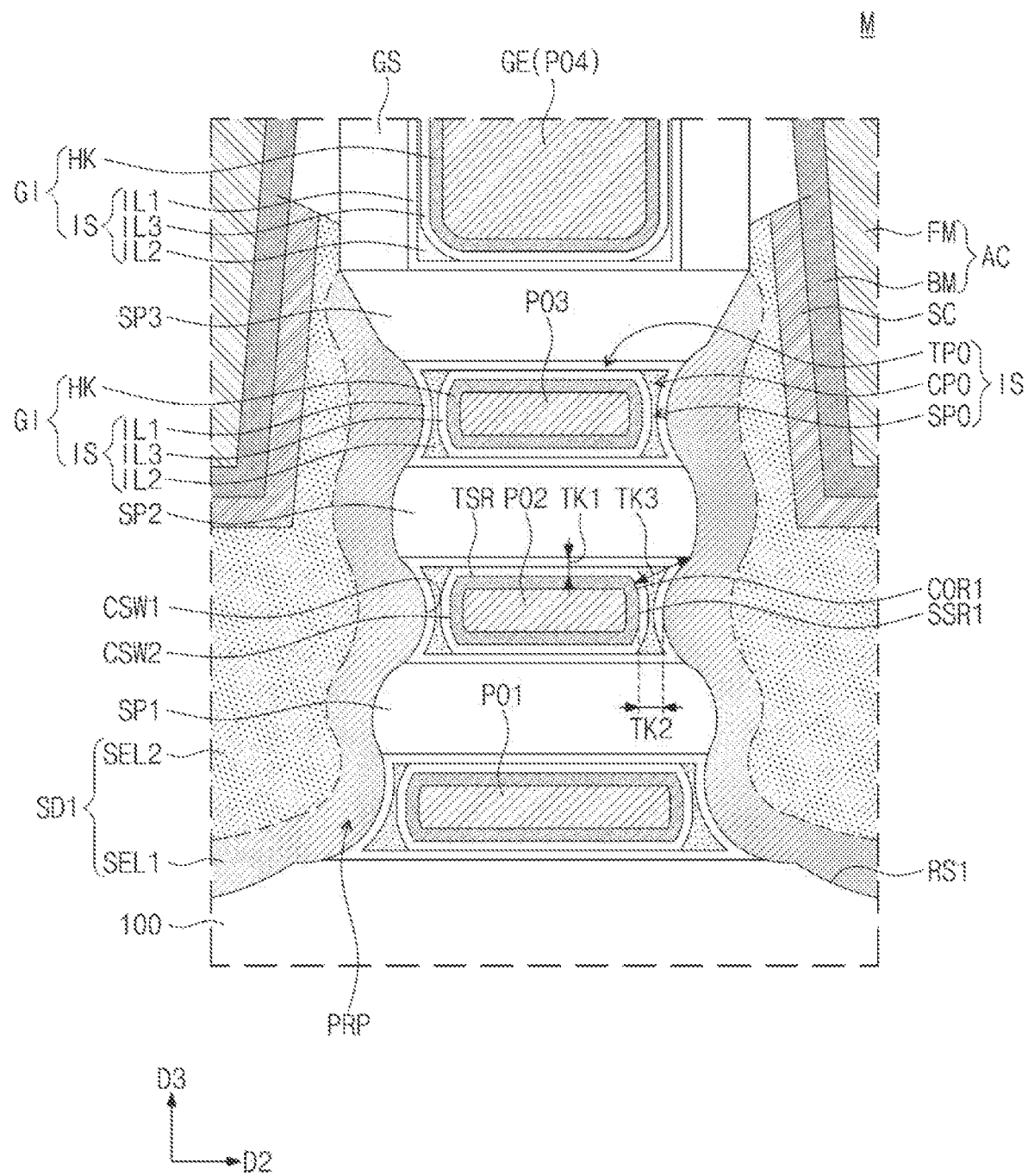
FIGS. 18 and 19 illustrate enlarged views showing an example of section M depicted in FIG. 5A.
Figure 19:
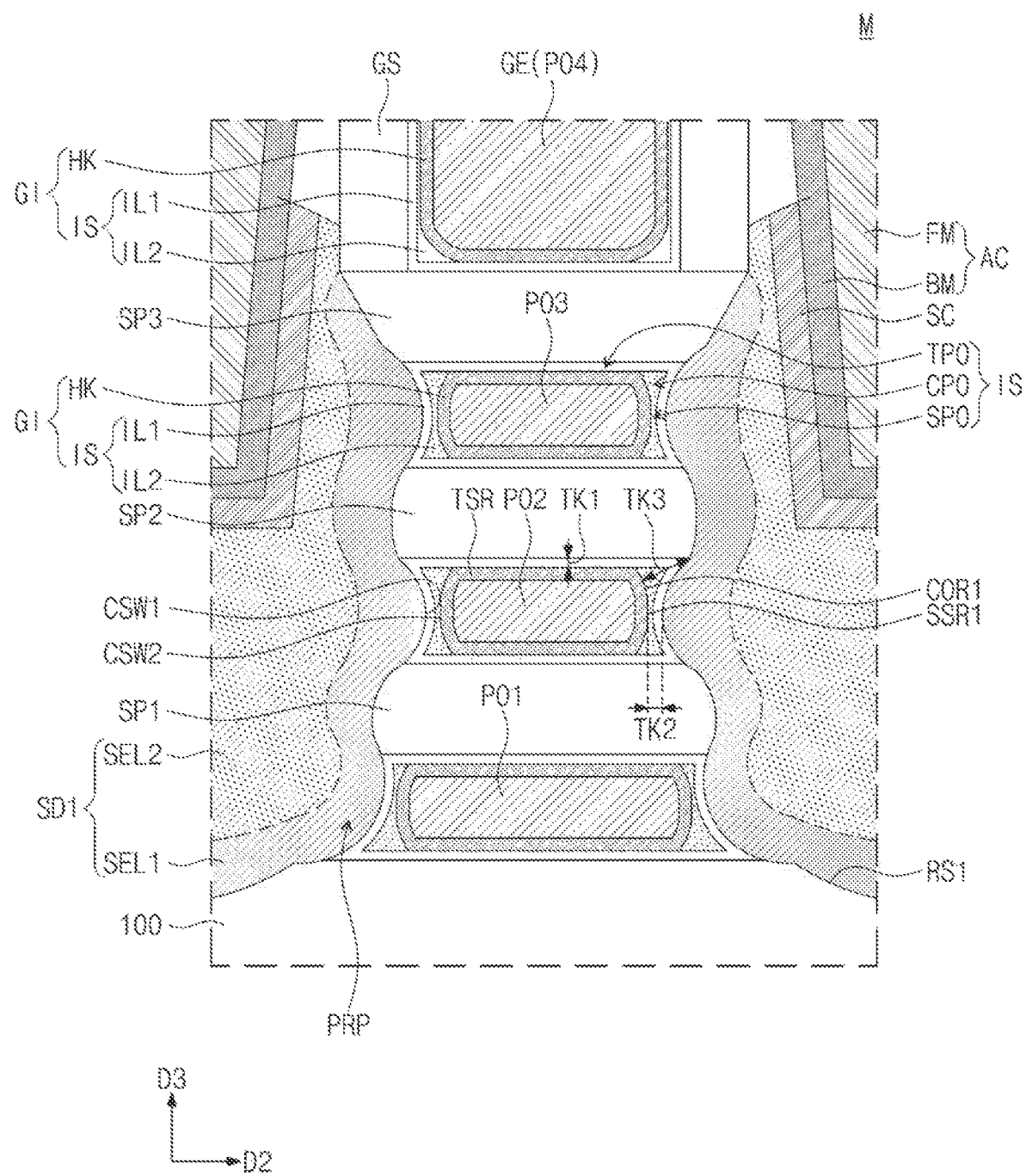

FIGS. 18 and 19 illustrate enlarged views showing an example of section M depicted in FIG. 5A.

Referring to FIG. 18, the inner spacer IS may include a first dielectric layer IL1, a second dielectric layer IL2, and a third dielectric layer IL3. The first and third dielectric layers IL1 and IL3 may be conformally formed to each have a uniform thickness. The second dielectric layer IL2 may have a thickness that is variable depending on position. The first and third dielectric layers IL1 and IL3 may include, for example, a silicon oxide layer. The second dielectric layer IL2 may include a silicon nitride layer or a silicon oxynitride layer.

The second dielectric layer IL2 may be omitted on the horizontal portion TPO of the inner spacer IS. The first and third dielectric layers IL1 and IL3 of the horizontal portion TPO may be in contact with each other. In some embodiments, the first and third dielectric layers IL1 and IL3 may include the same material (e.g., silicon oxide layer), and thus no distinct boundary (unlike that illustrated in FIG. 18) may be found between the first and third dielectric layers IL1 and IL3 on the horizontal portion TPO. It is noted that a boundary is illustrated on the horizontal portion TPO in FIG. 18 merely for convenience of illustrating the first and third dielectric layers IL1 and IL3 on the horizontal portion TPO.

On the vertical portion SPO of the inner spacer IS, the second dielectric layer IL2 may be provided between the first and third dielectric layers IL1 and IL3. For example, the second dielectric layer IL2 of the vertical portion SPO may have a thickness less than that of the third dielectric layer IL3 of the vertical portion SPO.

On the corner portion CPO of the inner spacer IS, the second dielectric layer IL2 may be provided between the first and third dielectric layers IL1 and IL3. The second dielectric layer IL2 of the corner portion CPO may have a relatively large thickness compared to the thickness of the second dielectric layer IL2 in the vertical portion SPO or in the horizontal portion TPO. The thickness of the second dielectric layer IL2 on the corner portion CPO may be greater than that of the third dielectric layer IL3 on the corner portion CPO.

The second dielectric layer IL2 may have the greatest thickness TK3 at the corner portion CPO having the largest thickness. The horizontal portion TPO, from which the second dielectric layer IL2 is omitted, may have the smallest thickness TK1. In an embodiment, the second dielectric layer IL2 may be omitted on the vertical portion SPO. For example, the second dielectric layer IL2 may be provided only on the corner portion CPO.

Referring to FIG. 19, the third dielectric layer IL3 may be omitted from the inner spacer IS of FIG. 18. For example, the inner spacer IS may include the first dielectric layer IL1 and the second dielectric layer IL2. The first dielectric layer IL1 may be conformally formed to have a uniform thickness. The second dielectric layer IL2 may have a thickness that is variable depending on position. The first dielectric layer IL1 may include, for example, a silicon oxide layer. The second dielectric layer IL2 may include a silicon nitride layer or a silicon oxynitride layer.

The second dielectric layer IL2 may be omitted on the horizontal portion TPO of the inner spacer IS. The first dielectric layer IL1 of the horizontal portion TPO may be directly interposed between the high-k dielectric layer HK and the each of the first to third semiconductor patterns SP1 to SP3.

On the vertical portion SPO of the inner spacer IS, the second dielectric layer IL2 may be provided between the high-k dielectric layer HK and the first dielectric layer IL1. For example, the second dielectric layer IL2 of the vertical portion SPO may have a thickness less than that of the first dielectric layer IL1 of the vertical portion SPO.

On the corner portion CPO of the inner spacer IS, the second dielectric layer IL2 may be provided between the high-k dielectric layer HK and the first dielectric layer IL1. The second dielectric layer IL2 of the corner portion CPO may have a relatively large thickness compared to a thickness of the second dielectric layer IL2 of the horizontal portion TPO and the vertical portion SPO. The thickness of the second dielectric layer IL2 on the corner portion CPO may be greater than the thickness of the first dielectric layer IL1 on the corner portion CPO.

The second dielectric layer IL2 may have the greatest thickness TK3 at the corner portion CPO having the largest thickness. The horizontal portion TPO, from which the second dielectric layer IL2 is omitted, may have the smallest thickness TK1. In an embodiment, the second dielectric layer IL2 may be omitted on the vertical portion SPO. For example, the second dielectric layer IL2 may be provided only on the corner portion CPO.

FIGS. 20A, 20B, 20C, and 20D illustrate cross-sectional views respectively taken along lines A-A', B-B', C-C', and D-D' of FIG. 4, showing a semiconductor device according to some embodiments.

Referring to FIGS. 4 and 20A to 20D, the device isolation layer ST may define a first active pattern AP1 and a second active pattern AP2 on an upper portion of the substrate 100. The first active pattern AP1 may be defined on the first active region AR1, and the second active pattern AP2 may be defined on the second active region AR2.

The device isolation layer ST may cover a lower sidewall of each of the first and second active patterns AP1 and AP2. An upper portion of each of the first and second active patterns AP1 and AP2 may protrude upwardly from the device isolation layer (see FIG. 20D).

The first active pattern AP1 may include, on its upper portion, first source/drain patterns SD1 and a first channel pattern CH1 between the first source/drain patterns SD1. The second active pattern AP2 may include, on its upper portion, second source/drain patterns SD2 and a second channel pattern CH2 between the second source/drain patterns SD2.

Referring back to FIG. 20D, each of the first and second channel patterns CH1 and CH2 may not include any of the first, second, and third semiconductor patterns SP1, SP2, and SP3 that are discussed above with reference to FIGS. 5A to 5D. Each of the first and second channel patterns CH1 and CH2 may have a semiconductor pillar shape that protrudes upwardly from the device isolation layer ST. Each of the first and second active patterns may have a fin shape that protrudes from the device isolation layer ST.

The gate electrode GE may be provided on a top surface and both sidewalls of each of the first and second channel patterns CH1 and CH2. In this sense, a transistor according to the embodiment illustrated in FIGS. 20A-20D may be a three-dimensional field effect transistor (e.g., FinFET) in which the gate electrode GE three-dimensionally surrounds the first and second channel patterns CH1 and CH2.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly connect to the first and second source/drain patterns SD1 and SD2. A gate contact GC may be provided to penetrate the second interlayer dielectric layer 120 and the gate capping pattern GP and to connect to the gate electrode GE.

A third interlayer dielectric layer 130 may be provided on the second interlayer dielectric layer 120. A fourth interlayer dielectric layer 140 may be provided on the third interlayer dielectric layer 130. A first metal layer M1 may be provided in the third interlayer dielectric layer 130. A second metal layer M2 may be provided in the fourth interlayer dielectric layer 140. A detailed description of the first metal layer M1 and the second metal layer M2 may be substantially the same as that discussed above with reference to FIGS. 4 and 5A to 5D.

Figure 20A:
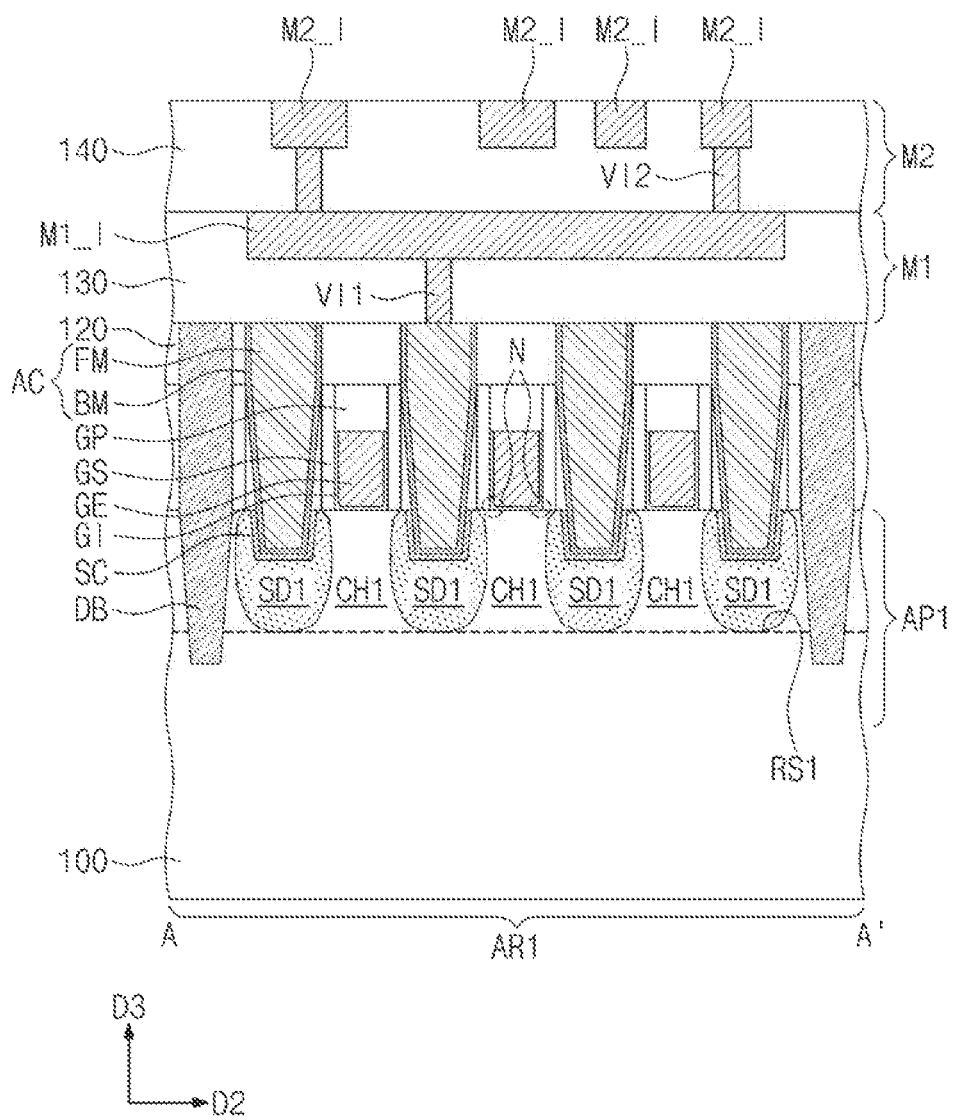
FIGS. 20A, 20B, 20C, and 20D illustrate cross-sectional views respectively taken along lines A-A', B-B', C-C', and D-D' of FIG. 4, showing a semiconductor device according to some embodiments.
Figure 20B:
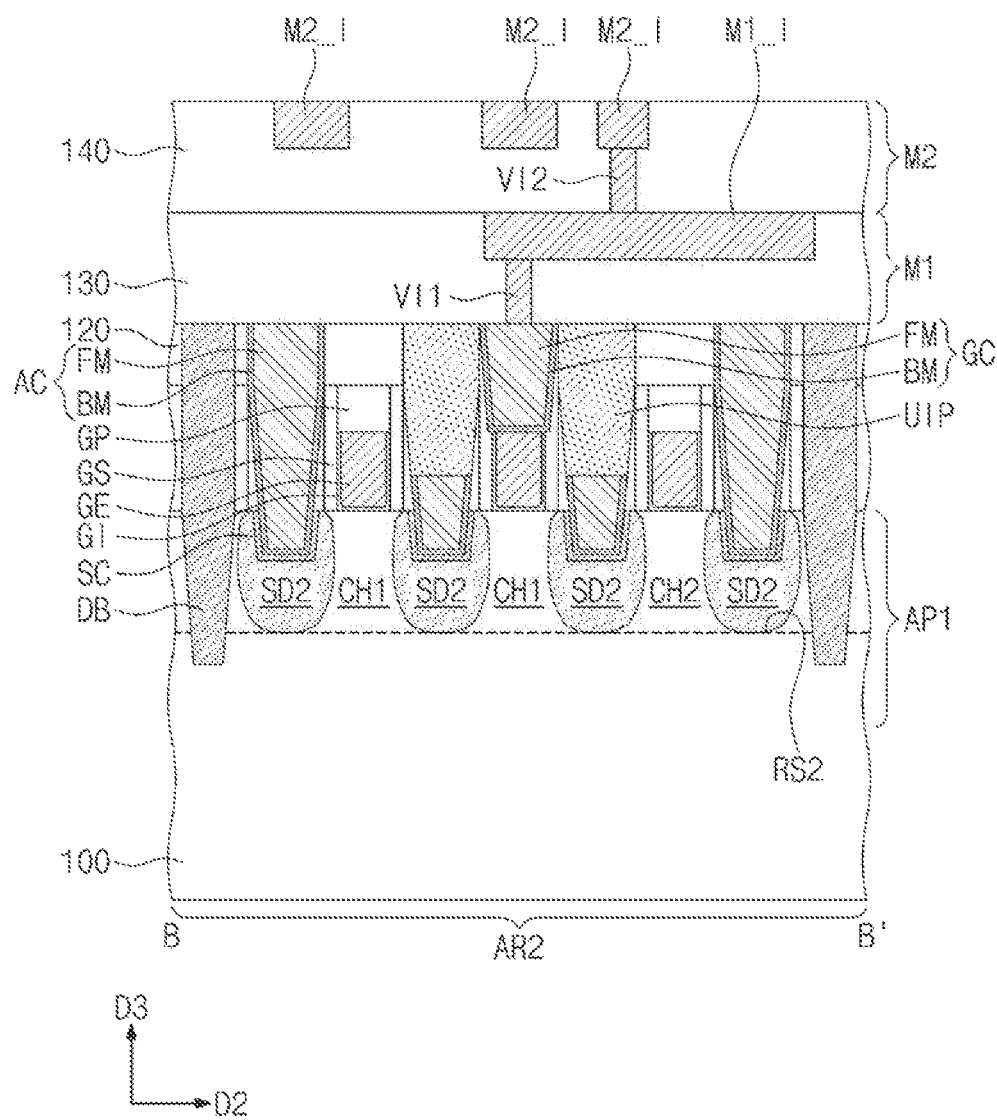
Figure 20C:
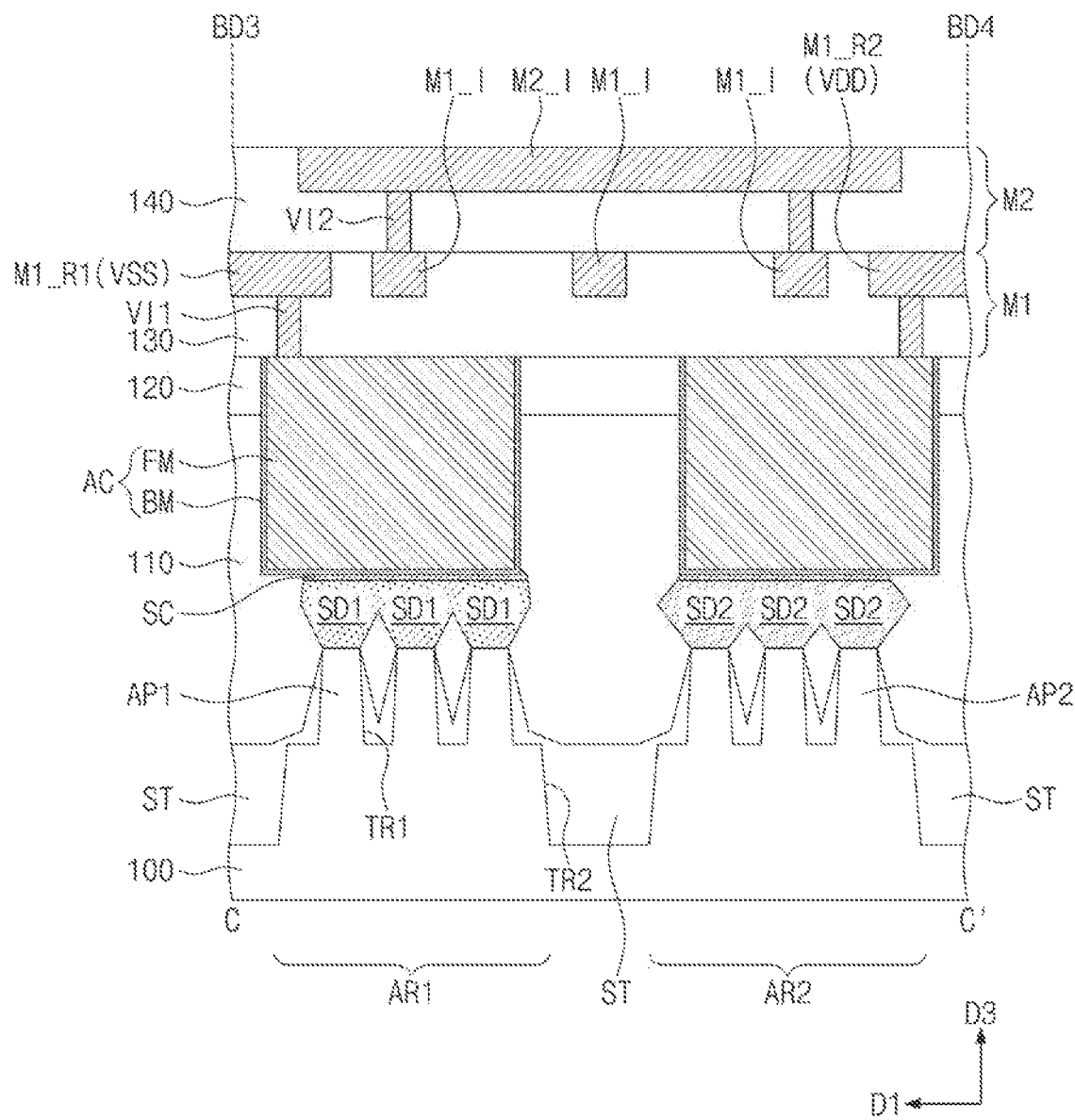
Figure 20D:
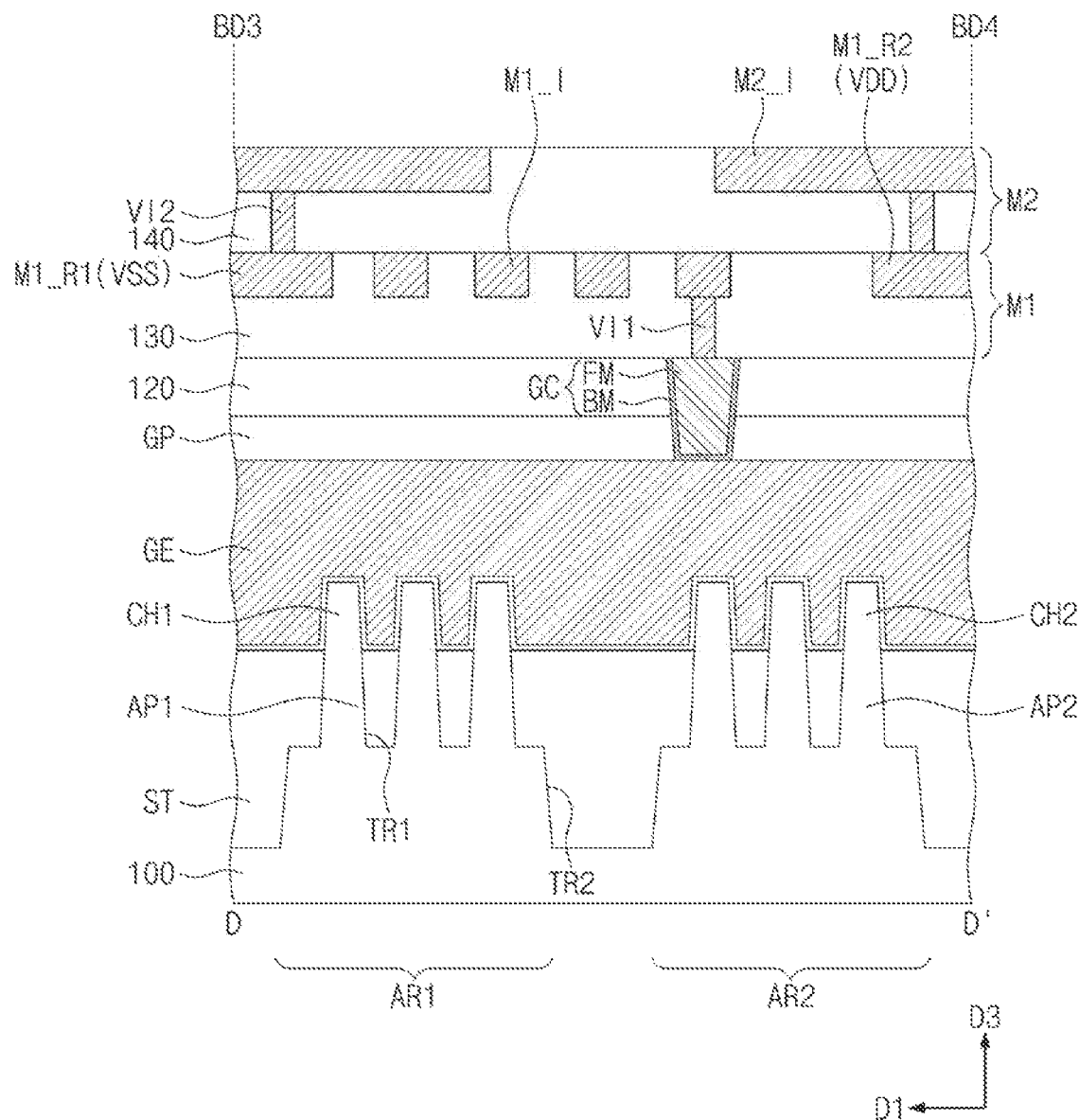

An enlarged view of section N depicted in FIG. 20A may be substantially the same as a view including the fourth portion PO4 of the gate electrode GE depicted in FIG. 6 and the gate dielectric layer GI that surrounds the fourth portion PO4. Referring back to FIGS. 6 and 20A, the gate dielectric layer GI on the first channel pattern CH1 may include the inner spacer IS and the high-k dielectric layer HK.

The inner spacer IS on the second corner COR2 of the high-k dielectric layer HK may have a relatively large thickness TK6. Therefore, it may be possible to prevent leakage current that easily occurs in a corner between a bottom surface and a sidewall of the gate electrode GE.

A three-dimensional field effect transistor may include an inner spacer configured such that a gate dielectric layer may prevent leakage current of gates. The inner spacer may have an increased thickness at its corner portion vulnerable to leakage current. Therefore, it may be possible to prevent gate leakage current and to improve electrical properties of devices.

The inner spacer of the various embodiments may include a horizontal portion having a relatively small thickness, and may thus provide a sufficient inner gate space. Accordingly, a gate electrode may stably fill the inner gate space.

Although some embodiments have been discussed with reference to accompanying figures, it will be understood that various changes in form and details may be made therein without departing from the spirit and scope of the features of the various embodiments. It therefore will be understood that the embodiments described above are just illustrative but not limitative in all aspects.

What is claimed is:

1. A semiconductor device comprising:
   a substrate that includes an active pattern;
   a channel pattern on the active pattern, the channel pattern including a plurality of semiconductor patterns that are vertically stacked and spaced apart from each other;
   a source/drain pattern connected to the plurality of semiconductor patterns;
   a gate electrode on the plurality of semiconductor patterns; and
   a gate dielectric layer between the gate electrode and the plurality of semiconductor patterns,
   wherein the gate electrode includes a first portion between a first semiconductor pattern and a second semiconductor pattern that are adjacent ones of the plurality of semiconductor patterns, the first portion having a sidewall that is convex, and a second portion on an uppermost semiconductor pattern of the plurality of semiconductor patterns,
   wherein the gate dielectric layer includes:
     a high-k dielectric layer that surrounds the first portion of the gate electrode; and
     an inner spacer on the high-k dielectric layer,
   wherein the inner spacer includes:
     a horizontal portion between the high-k dielectric layer and the second semiconductor pattern, the horizontal portion having a first thickness;
     a vertical portion between the high-k dielectric layer and the source/drain pattern, the vertical portion having a second thickness; and
     a corner portion between the horizontal portion and the vertical portion, the corner portion having a third thickness,
   wherein the first thickness is less than the second thickness,
   wherein the second thickness is less than the third thickness,
   wherein the inner spacer between the second portion and the uppermost semiconductor pattern has a fourth thickness,
   wherein the inner spacer between the second portion and a gate spacer has a fifth thickness, wherein the inner spacer between the second portion and an inside corner where the uppermost semiconductor pattern contacts the gate spacer has a sixth thickness, wherein the fourth thickness is less than the fifth thickness, and wherein the fifth thickness is less than the sixth thickness.

2. The semiconductor device of claim 1, wherein a ratio of the second thickness to the first thickness is in a range of about 1.5 to about 3.

3. The semiconductor device of claim 1, wherein a ratio of the third thickness to the first thickness is in a range of about 2.5 to about 5.

4. The semiconductor device of claim 1, wherein
the first thickness is less than a thickness of the high-k dielectric layer, and
the third thickness is greater than the thickness of the high-k dielectric layer.

5. The semiconductor device of claim 1, wherein the inner spacer includes a first dielectric layer and a second dielectric layer,
wherein the first dielectric layer includes a silicon oxide layer, and
wherein the second dielectric layer includes a silicon nitride layer or a silicon oxynitride layer.

6. The semiconductor device of claim 5, wherein the second dielectric layer is omitted on the horizontal portion.

7. The semiconductor device of claim 5, wherein the inner spacer further includes a third dielectric layer,
wherein the third dielectric layer includes a silicon oxide layer, and
wherein the second dielectric layer is between the first dielectric layer and the third dielectric layer.

8. The semiconductor device of claim 1, wherein the inner spacer directly covers the first semiconductor pattern, the second semiconductor pattern, and the source/drain pattern.

9. The semiconductor device of claim 1, wherein the source/drain pattern includes a protrusion that protrudes toward the first portion of the gate electrode,
wherein the protrusion of the source/drain pattern has a first convex sidewall directed toward the first portion of the gate electrode, and
wherein the sidewall of the first portion of the gate electrode faces the first convex sidewall of the protrusion.

10. A semiconductor device comprising:
a substrate that includes an active pattern;
a channel pattern on the active pattern, the channel pattern including a plurality of semiconductor patterns that are vertically stacked and spaced apart from each other;
a pair of source/drain patterns on the active pattern, the plurality of semiconductor patterns being between the pair of source/drain patterns;
a gate electrode on the plurality of semiconductor patterns; and
a gate dielectric layer between the gate electrode and the plurality of semiconductor patterns,
wherein the gate electrode includes:
a first portion between a first semiconductor pattern and a second semiconductor pattern that are adjacent ones of the plurality of semiconductor patterns, and the first portion having a sidewall that is convex, and
a second portion on an uppermost semiconductor pattern of the plurality of semiconductor patterns,
wherein the gate dielectric layer includes:
a high-k dielectric layer that surrounds the first portion of the gate electrode; and
an inner spacer on the high-k dielectric layer,
wherein an inner region is defined by the pair of source/drain patterns, the first semiconductor pattern, and the second semiconductor pattern,
wherein the inner spacer is within the inner region,
wherein the inner spacer includes an inner gate space,
wherein the high-k dielectric layer and the first portion of the gate electrode are in the inner gate space,
wherein the inner region has a first side,
wherein the inner gate space has a second side adjacent to the first side,
wherein the inner spacer includes:
a horizontal portion between the high-k dielectric layer and the second semiconductor pattern;
a vertical portion between the high-k dielectric layer and one of the pair of source/drain patterns; and
a corner portion between the horizontal portion and the vertical portion,
wherein a thickness of the vertical portion is greater than a thickness of the horizontal portion,
wherein a thickness of the corner portion is greater than the thickness of the vertical portion,
wherein the inner spacer between the second portion and the uppermost semiconductor pattern has a fourth thickness,
wherein the inner spacer between the second portion and a gate spacer has a fifth thickness,
wherein the inner spacer between the second portion and an inside corner where the uppermost semiconductor pattern contacts the gate spacer has a sixth thickness
wherein the fourth thickness is less than the fifth thickness, and
wherein the fifth thickness is less than the sixth thickness.

11. The semiconductor device of claim 10, wherein each of the pair of source/drain patterns includes a protrusion that protrudes toward the first portion of the gate electrode,
wherein the protrusion has a first convex sidewall directed toward the first portion of the gate electrode, and
wherein the sidewall of the first portion of the gate electrode faces the first convex sidewall of the protrusion.

12. The semiconductor device of claim 11, wherein:
the first side of the inner region is concave corresponding to the first convex sidewall, and
the second side of the inner region is convex corresponding to the sidewall of the first portion.

13. The semiconductor device of claim 10, wherein the inner spacer includes a first dielectric layer and a second dielectric layer,
wherein the first dielectric layer includes a silicon oxide layer, and
wherein the second dielectric layer includes a silicon nitride layer or a silicon oxynitride layer.

* * * * *